United States Patent [19]

Faris

[11] 4,334,158
[45] Jun. 8, 1982

[54] SUPERCONDUCTING SWITCH AND AMPLIFIER DEVICE

[75] Inventor: Sadeg M. Faris, Yorktown Heights, N.Y.

[73] Assignee: International Business Machines Corporation, Armonk, N.Y.

[21] Appl. No.: 156,948

[22] Filed: Jun. 6, 1980

[51] Int. Cl.³ .................. H03K 17/92; H03K 19/195; H03K 3/38
[52] U.S. Cl. .................................. 307/462; 307/245; 307/476; 357/6
[58] Field of Search ............... 307/245, 277, 306, 462, 307/476; 357/5, 6

[56] References Cited

U.S. PATENT DOCUMENTS

| | | | |
|---|---|---|---|
| 3,116,427 | 12/1963 | Giaever | 307/245 |
| 3,204,115 | 8/1965 | Parmenter | 307/306 |
| 3,689,780 | 9/1972 | Meissner et al. | 307/277 |
| 4,157,555 | 6/1979 | Gray | 357/6 |

OTHER PUBLICATIONS

L. R. Testardi, "Destruction of Superconductivity by Laser Light", Physical Review B, vol. 4, No. 7, Oct. 1, 1971, pp. 2189-2196.

P. M. Ginsberg, "Upper Limit for Quasi-Particle Recombination Time in a Superconductor", Physical Review Letters, vol. 8, No. 5, Mar. 1, 1962, pp. 204-207.

K. E. Gray, "A Superconducting Transistor", Appl. Phys. Letter, vol. 32, No. 6, Mar. 15, 1978, pp. 392-395.

W. H. Parker, "Modified Heating Theory of Nonequilibrium Superconductors", Physical Review B, vol. 12, No. 9, Nov. 1, 1975, pp. 3667-3672.

Primary Examiner—John Zazworsky
Attorney, Agent, or Firm—Jackson E. Stanland

[57] ABSTRACT

An amplifying or switching superconductive device is described whose current-voltage characteristic is drastically altered by heavy injection of excess energetic quasi-particles. In this device, the superconducting bandgap of a superconducting layer is greatly altered by overinjection of energetic quasi-particles so that the bandgap changes greatly with respect to its thermal equilibrium value, and in most cases is made to vanish. In a preferred embodiment, a three electrode device is fabricated where at least one of the electrodes is a superconductor. Tunnel barriers are located between the electrodes. A first tunnel junction is used to heavily inject energetic quasi-particles into the superconducting electrode to change its superconducting bandgap drastically. In turn, this greatly modifies the current-voltage characteristics of the second tunnel junction. This device can be used to provide logic circuits, or as an amplifier, and has an output sufficiently large that it can drive other similar devices.

67 Claims, 36 Drawing Figures

FIG. 1.1
PRIOR ART
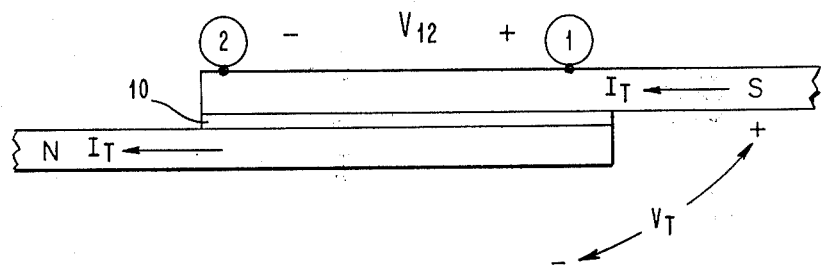
FIG. 1.2
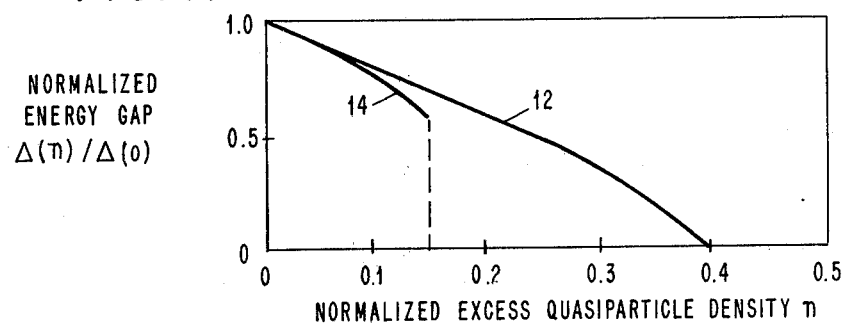
FIG. 1.3
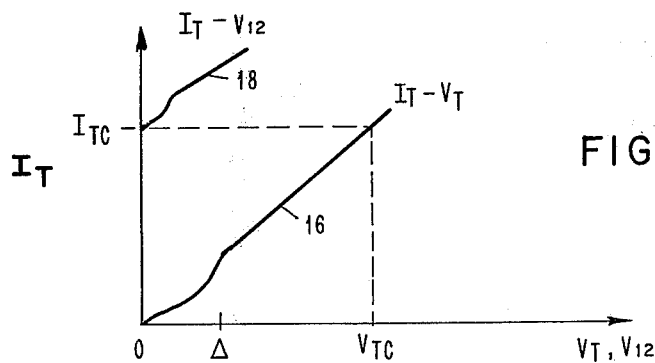

FIG. 2.1
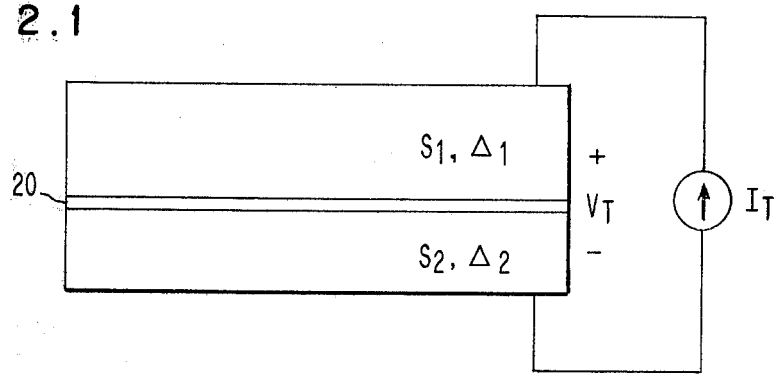
FIG. 2.2
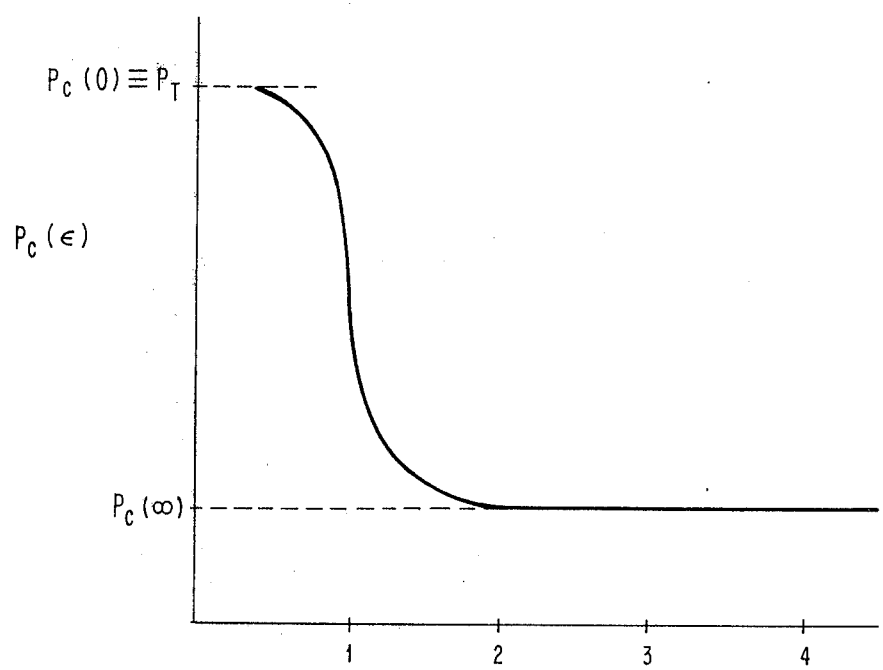

FIG. 3.1
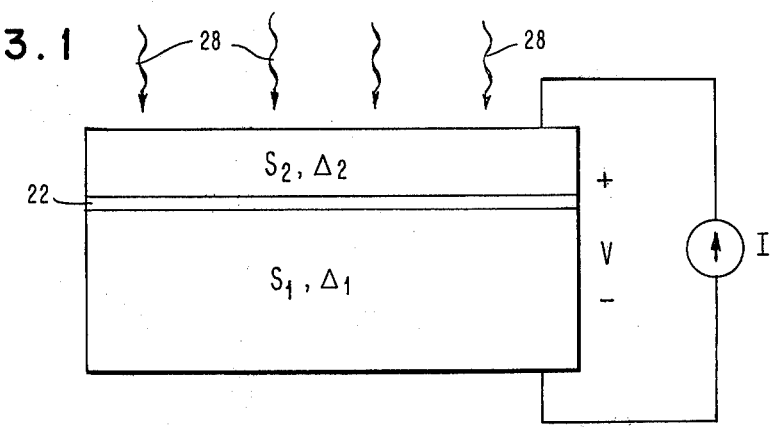
FIG. 3.2
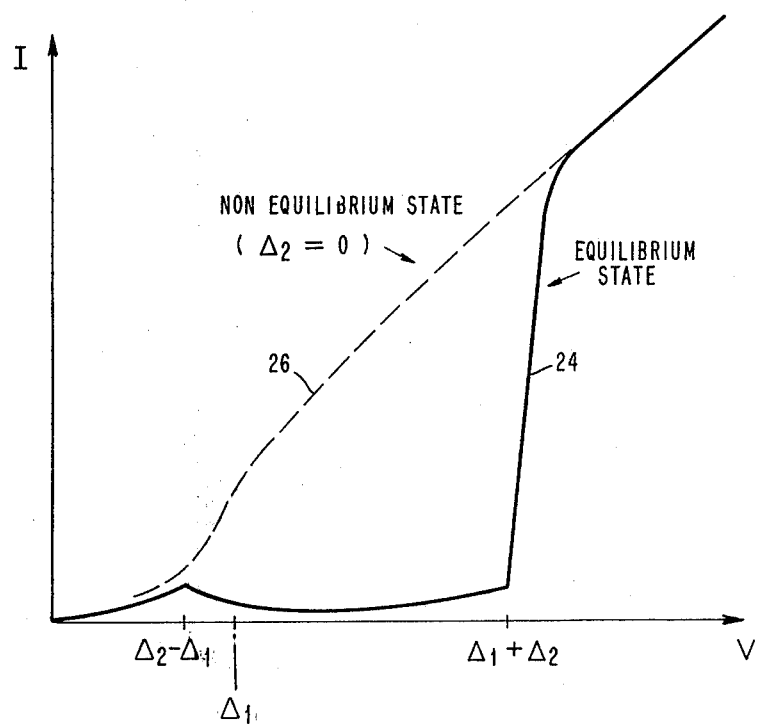

FIG. 4.1
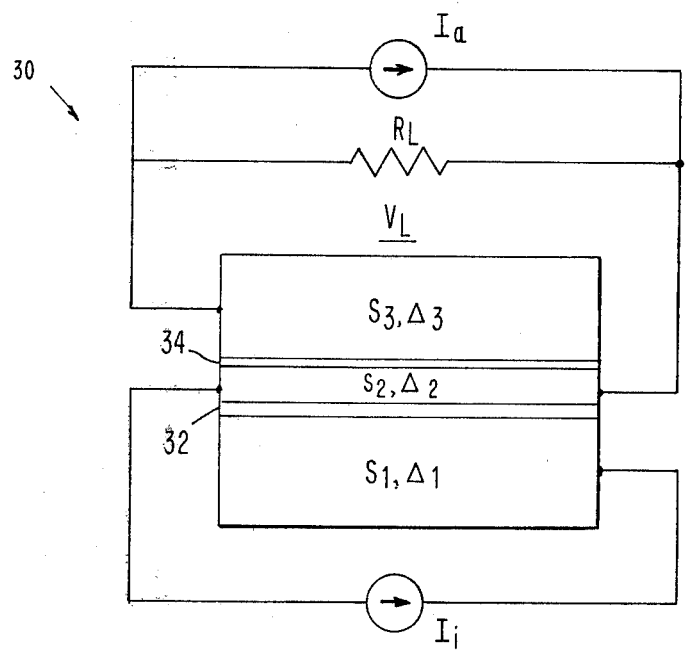
FIG. 4.2
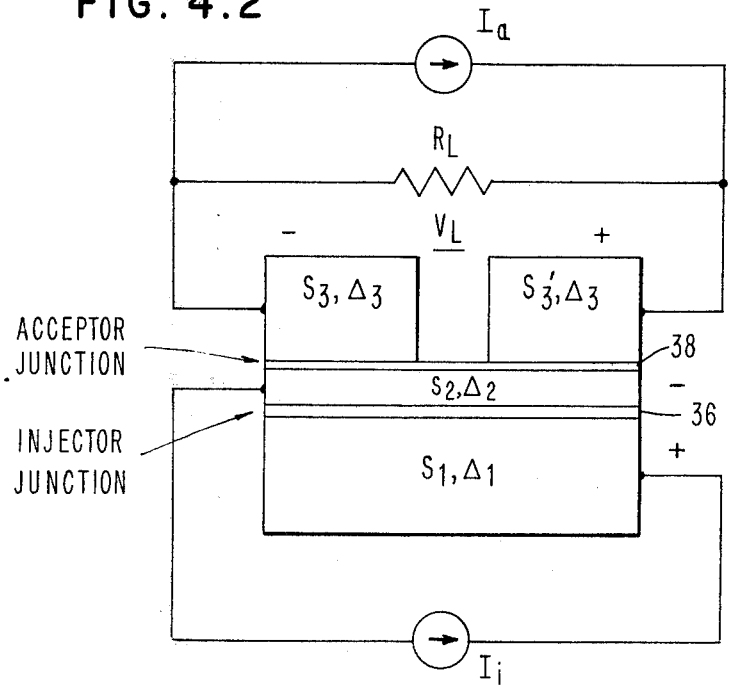

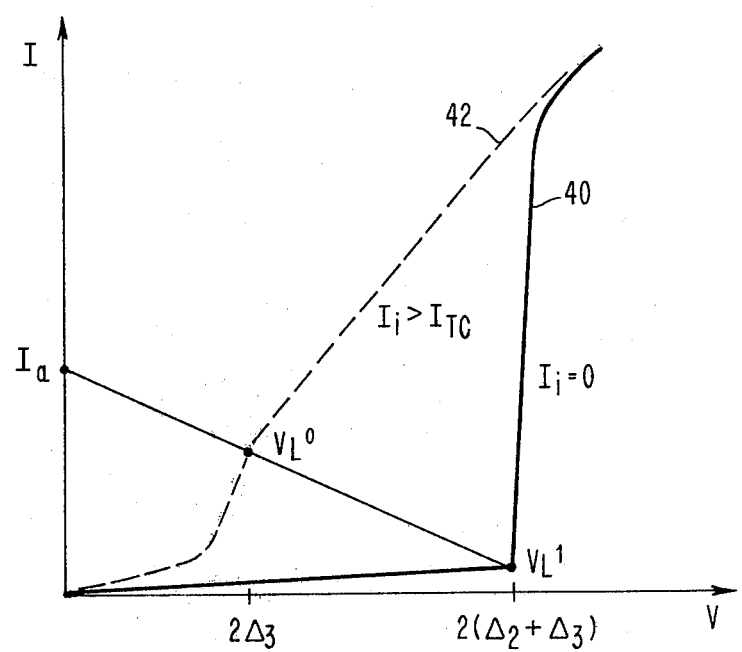
FIG. 4.3

FIG. 5.1
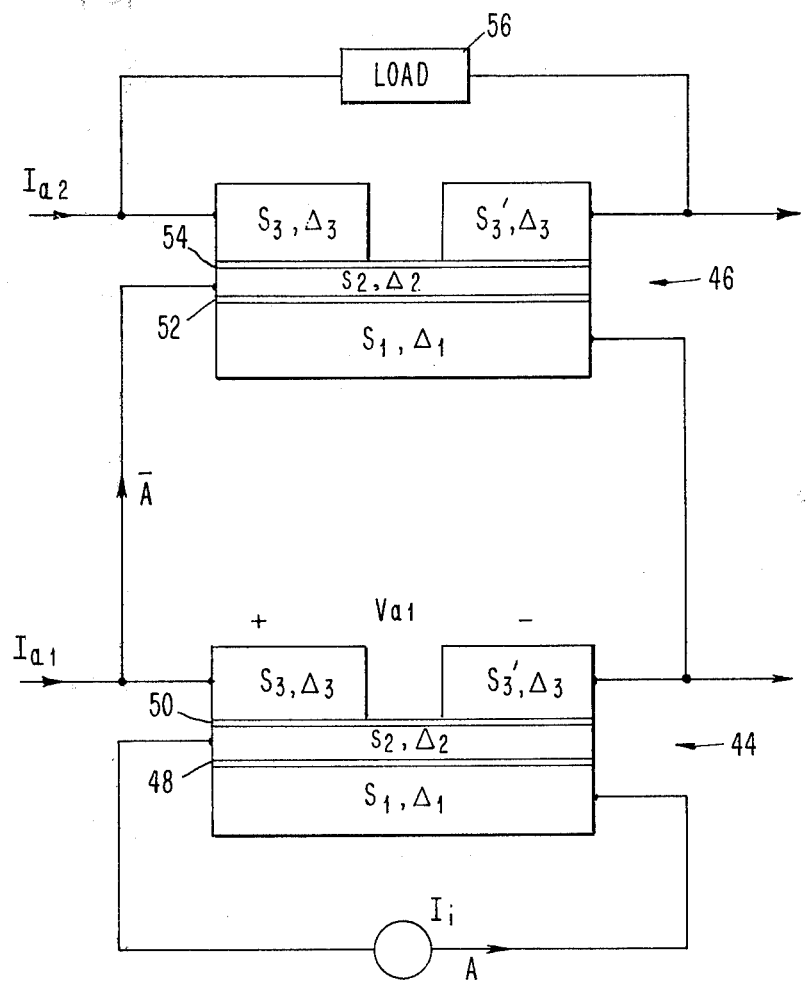

FIG. 5.2
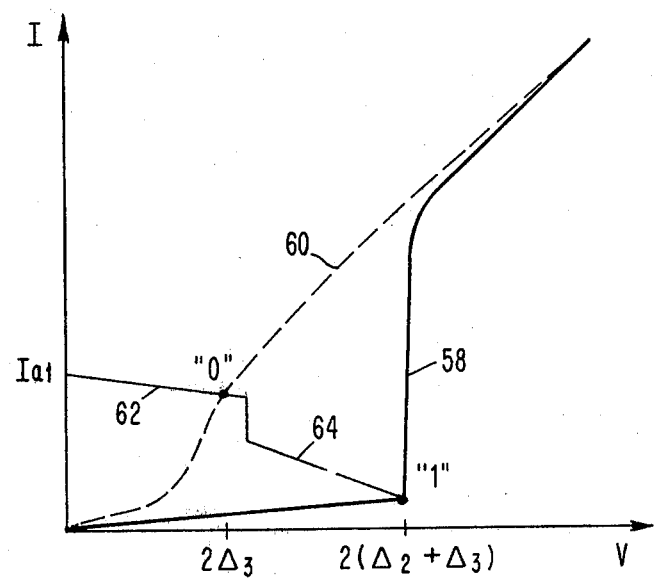

FIG. 10.1
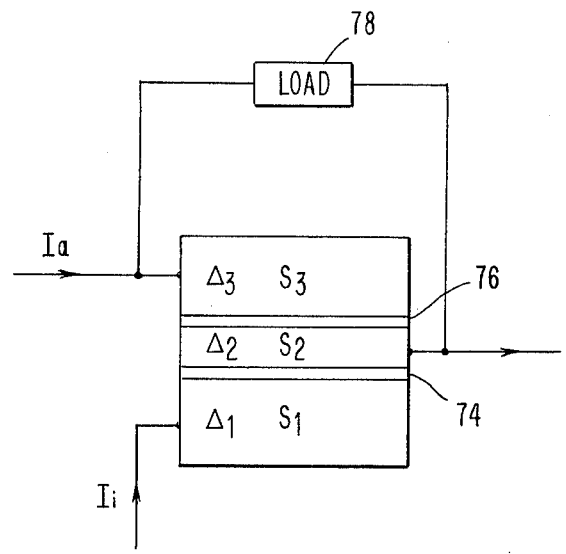
FIG. 10.2
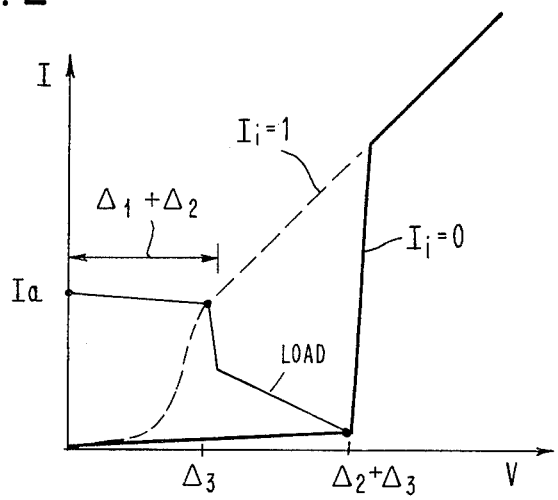

FIG. 11.1
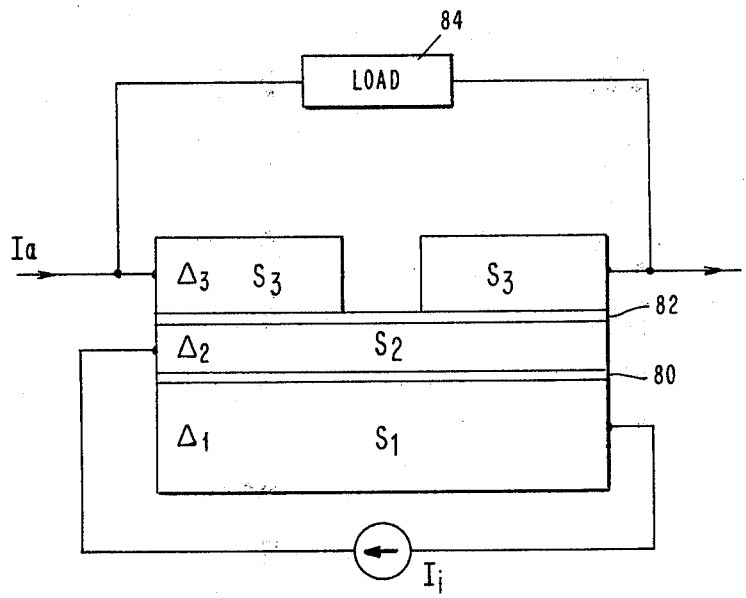
FIG. 11.2
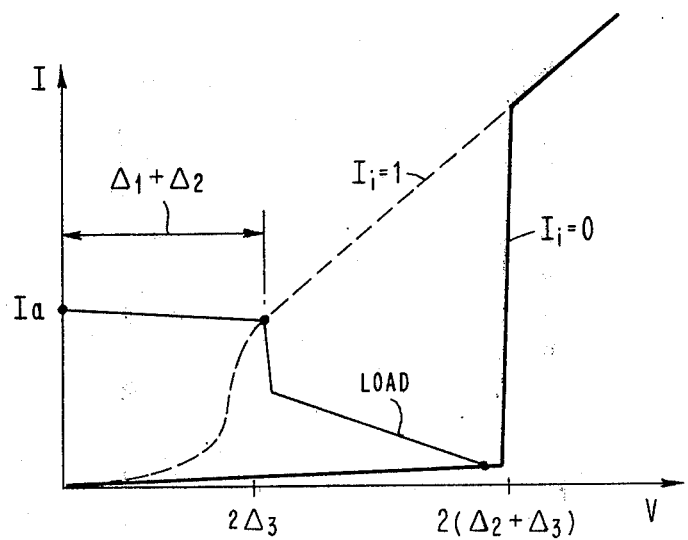

FIG. 14.1
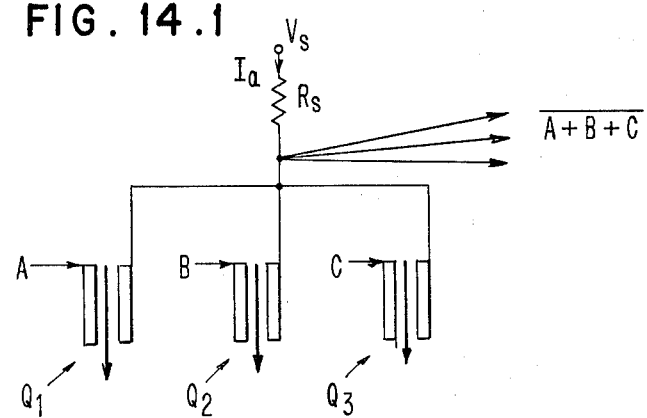
FIG. 14.2
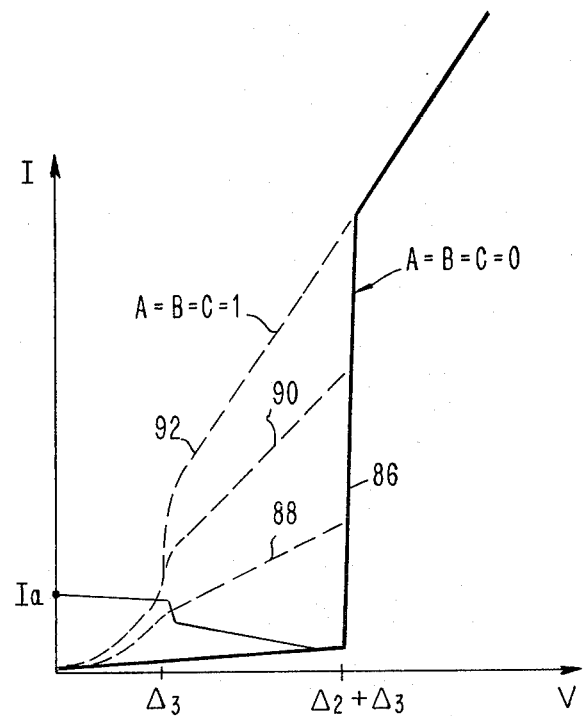

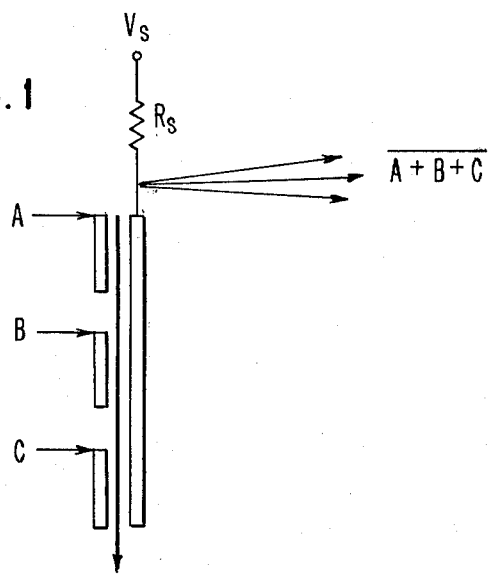
FIG. 15.1
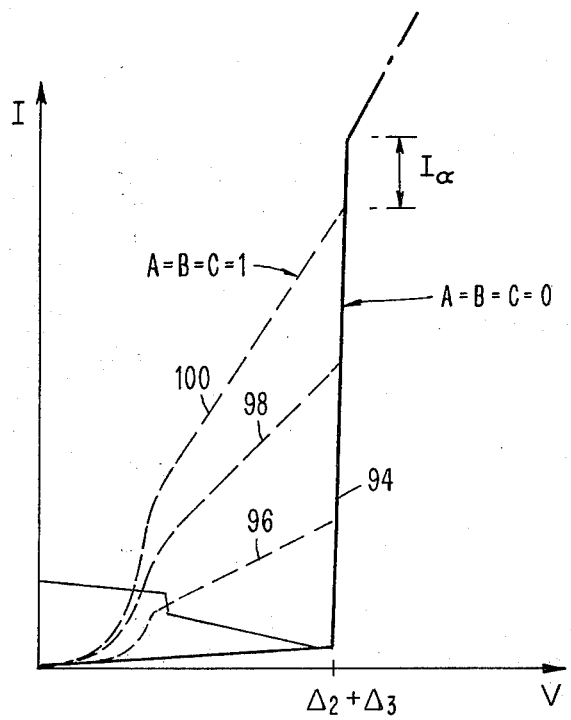
FIG. 15.2

FIG. 20.1
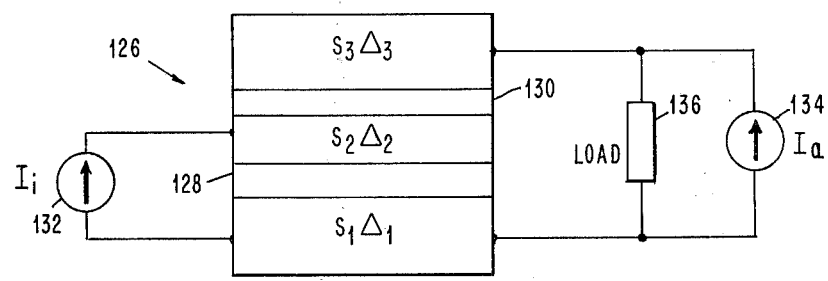
FIG. 20.2
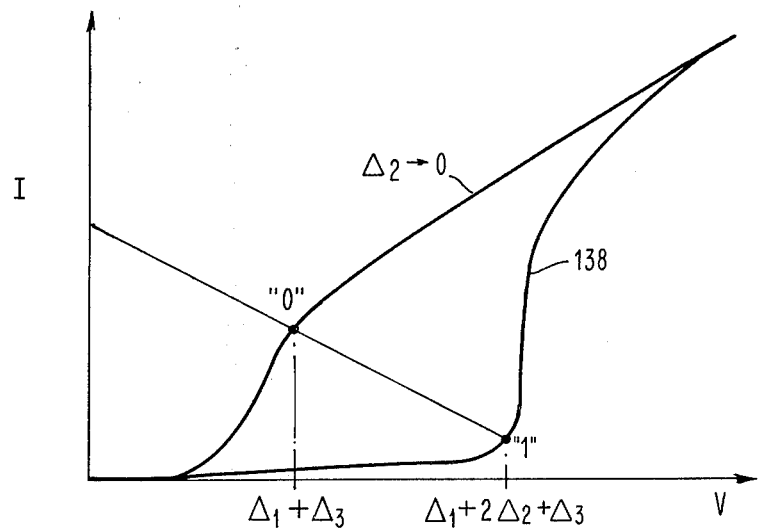

FIG. 21.1
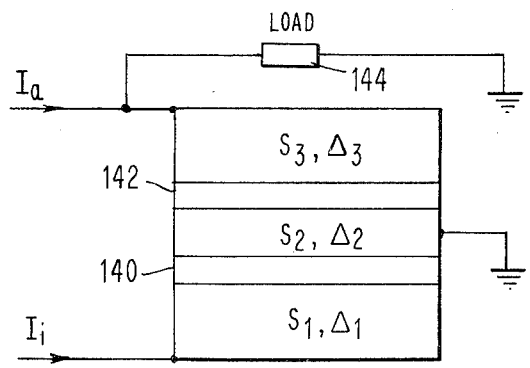
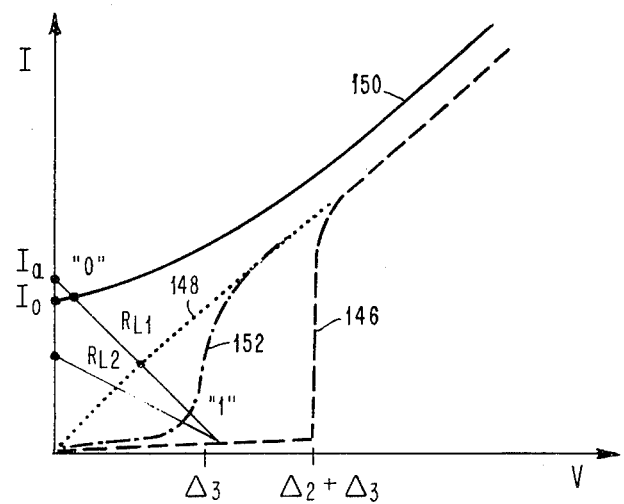
FIG. 21.2
---- $\beta \gg 1$
—— $\beta \ll 1$
$P \gtrsim P_c$ { ········ $\Delta_2 + \Delta_3 \to 0$
—·—·— $\Delta_2 \to 0$

SUPERCONDUCTING SWITCH AND AMPLIFIER DEVICE

DESCRIPTION

Technical Field

This invention relates to an amplifying or switching superconducting device, and in particular to a superconducting device whose current-voltage characteristic is altered by heavy injection of excess quasi-particles and which can be fabricated as a three terminal device. The device can be used for logic operations, or as an amplifier, and has an output that is sufficiently large to drive another such device.

BACKGROUND ART

Superconducting switching devices are well known in the art, and are represented by devices such as the cryotron and the Josephson tunneling device. In the cryotron, the superconducting gap $\Delta$ of a film is caused to vanish (i.e., the film becomes normal). This can occur by several mechanisms, including passing a current through the film having a magnitude greater than the critical current of the film, applying an external magnetic field, and by heating the film.

A Josephson tunneling device is one which exhibits a zero-voltage current between two superconductors separated by a very thin tunnel barrier. By increasing the current through the device, or by applying a magnetic field to the device, the device can be made to switch to a non-zero voltage state. However, the device remains superconducting at all times.

Another superconducting device is that represented by the transistor of U.S. Pat. No. 4,157,555. In that device, three superconductors are separated from one another by two insulating layers to form two tunnel junctions. Depending on the biasing applied to these tunnel junctions, a change can result in the total current flow through one of the junctions, which change is greater than the amount of current injected into one of the superconductors. In this device, quasi-particles are injected into the middle electrode, but the number of quasi-particles injected is small. That is, the number is in the order of the number of thermally excited quasi-particles in the superconductor. This means that the superconducting gap $\Delta$ of the superconductor into which the quasi-particles are injected remains near its equilibrium value. In that device, any change in $\Delta$ due to the quasi-particle injection is much less than 1% of its value at equilibrium.

The device of U.S. Pat. No. 4,157,555 cannot function as a switch in the digital sense. Because the superconducting gap remains near its equilibrium value, that device functions only as a small signal analog amplifier (even if the tunnel current density of its output junction is much greater than the tunnel current density of its input junction) and it is not possible to provide a sufficiently large output to drive another similar device. Stated another way, the output of that device is not sufficiently large to change the state of another such device being driven by it.

In the device of U.S. Pat. No. 4,157,555, the difference in tunnel resistance between the two tunnel junctions of the device is such that the device is restricted to small signal analog amplification. In that device, recombination times must be very long with respect to the tunneling rate, and for this reason aluminum is chosen as a representative superconductor. However, these materials are not favorable if large signal amplification is desired, or if it is desired to have a switch which has distinguishable output states and which can drive another such switch.

The transistor of U.S. Pat. No. 4,157,555 is not an inverter and cannot operate as a switch in a digital sense. Its collector junction is biased at an amount less than the gap voltage and for this reason, as well as the small number of quasi-particles injected, a small output results. At the present time, there is no known cryogenic switch which provides digital inversion, as can be obtained with semiconductor bipolar and FET devices.

In contrast with the prior art, a cryogenic switch usable for digital switching and large signal analog amplification is described. This switch uses heavy injection of excess energetic quasi-particles into a thin superconducting film, in order to drastically change the superconducting gap of this film. In most applications, the superconducting gap is driven to zero. This device can be used to switch other devices since it provides a large output, and can be used to build a NOR block. This NOR block can in turn be used to design all types of logic circuits, without the requirement for separate AND, OR, and INVERT circuits, as would be needed when using other types of cryogenic switches.

The present device is based upon the discovery of an unexpected threshold power density relationship in which the current-voltage characteristics of the device drastically change when the superconducting gap $\Delta$ changes by a large amount. This threshold power density relationship leads to a switch exhibiting high gain, inverting characteristics, high noise immunity, and high discrimination between its output states.

The operation of the present device is based on QUasi-particle Injection Tunneling, and hence is called the QUITERON. It relies on heavy injection of excess quasi-particles in order to cause a superconducting gap to drastically change, and generally to vanish. It distinguishes from the experiments of Testardi, Phys. Rev. B4, 2189 (1971), in that a complete three terminal device is obtained capable of digital switching. In Testardi's experiments, he discovered that thin superconducting films can be irradiated by optical pulses to drive them into a normal state and back to the superconducting state very rapidly. Testardi suggested that an excess number of quasi-particles larger than the usual thermal equilibrium number were responsible for this phenomenon. However, no devices were suggested or described.

Non-equilibrium superconductivity is a subject of intense investigation, as represented by the work of Ginzberg, Phys. Rev. Lett., 8, 204 (1962). In that reference, Ginzberg describes a double junction configuration used to measure quasi-particle recombination lifetime. Still further, K. E. Gray, Appl. Phys. Lett., 32, 392 (1978) reported measurement of small signal gain in a double junction configuration and found that, at an extremely low level of injection, its operation was analogous to that of a transistor. This operation is described more fully in the Gray patent previously referenced (U.S. Pat. No. 4,157,555).

The present device is one which uses non-equilibrium phenomena to provide advantages over previous cryogenic switches. Accordingly, it is a primary object of the present invention to provide a superconducting digital switch capable of inverting characteristics.

It is another object of the present invention to provide a superconducting device in which the superconducting band gap of a thin film is drastically changed by overinjection of energetic excess quasi-particles.

It is another object of this invention to provide a three terminal superconducting device which can be fabricated in very dense structures and which exhibits high discrimination between multiple output states.

It is another object of this invention to provide a superconducting switch which has a gain greater than 10 and which can exhibit latching or non-latching operation.

It is another object of the present invention to provide a superconducting switch which can be designed to exhibit no resonance and very low sensitivity to trapped flux.

It is another object of the present invention to provide a superconducting switch relying on heavy injection of excess energetic quasi-particles, which exhibits high noise immunity, and which can be switched by extremely low energy excitation.

It is still another object of the present invention to provide a multi-state superconducting switch in which one of the states is a zero voltage Josephson current state, and wherein heavy injection of excess energetic quasi-particles is utilized to switch the device.

It is a further object of the present invention to provide a NOR block and a flip-flop circuit using such a superconducting switch.

It is another object of the present invention to provide a superconducting switch having distinguishable output states in which the output of one switch can be used to drive the input of a second switch in order to cause the state of said second switch to change when said input is present.

It is another object of the present invention to provide a superconducting switch exhibiting a threshold power density curve and which relies upon heavy injection of excess energetic quasi-particles.

It is another object of the present invention to provide a superconducting switch relying upon heavy injection of excess energetic quasi-particles in which flexibility in choice of materials is possible.

It is another object of the present invention to provide a superconducting switch in which the current-voltage characteristics of a tunnel junction are drastically altered by overinjection of excess energetic quasi-particles into one electrode of the tunnel junction.

It is a further object of the present invention to provide a three terminal superconducting switch, having an electrode thereof in which the superconducting gap is caused to vanish by overinjection of excess energetic quasi-particles.

It is another object of the present invention to provide a multi-input superconducting switch relying upon overinjection of excess energetic quasi-particles in order to locally reduce the superconducting band gap to zero.

It is another object of the present invention to provide a superconducting switch having distinguishable output states, in which switching between states occurs through heavy injection of excess energetic quasi-particles, and wherein said switch can be used for the design of logic circuits and memory circuits.

These and other objects, features, and advantages will be more apparent from the following more particular description of the preferred embodiments.

DISCLOSURE OF INVENTION

The superconducting device is comprised of a plurality of conducting layers which function as electrodes, there being tunnel barriers between the electrodes. In a particular embodiment, a tunnel junction, termed an injector junction, is used to heavily inject excess quasi particles into a superconducting layer which is one electrode of a second tunnel junction, termed the acceptor junction. Due to the heavy injection of excess quasi particles, the current-voltage characteristics of the acceptor tunnel junction are changed. In this manner different voltage states are provided which are easily distinguishable from one another. This device can provide an inverting characteristic, and is the only known cryogenic device which has this property. Because of this, it can be used to design circuits, such as NOR blocks, which are similar to those designed with bipolar and FET devices.

Since the device is capable of a multiple number of output states which are clearly distinguishable from one another, it can be used as a switch. Due to the large output that results, one such switch can be used to drive another in order to make complete circuits comprised of these switches. An additional application is that of an analog amplifier in which analog signals can be greatly amplified. For this use, heavy injection of excess quasi particles is also required.

The modification of the tunneling properties of the acceptor junction depends on a heavy injection of an excess number of quasi particles. By "heavy", it is meant that the superconducting gap $\Delta$ of the superconducting layer comprising an electrode of the acceptor junction is drastically changed, and is usually driven to $\Delta = 0$. The number of quasi-particles injected is greater than the usual thermal equilibrium number of quasi particles, and is typically at least two orders of magnitude greater than the number which would be produced by thermal excitation. In contrast with the superconducting transistor of U.S. Pat. No. 4,157,555, where the superconducting gap $\Delta$ changes by an amount must less than 1%, the superconducting gap $\Delta$ changes drastically in the present invention, and is generally driven to zero.

In the practice of this invention, it has been discovered that a threshold power density exists at which an excess quasi particle concentration causes the order parameter (superconducting gap) to locally vanish. Thus, when the present invention is used as a switch, the amount of power applied is at least of the order of the threshold power density, and generally exceeds that density, in order to change the state of the device. The superconducting electrodes, geometrical configuration, and type of load are chosen so that the output power of one device is sufficient to exceed the power density threshold of another identical device.

While the injector junction is generally comprised of a single tunnel barrier layer, multiple tunnel barrier layers can be used to provide multiple inputs to the injector. The injector tunnel barrier can be comprised of an insulator, a normal metal, a semi-metal, or even a semiconductor. On the other hand, the barrier layer used for the acceptor tunnel junction is generally an insulator, since the acceptor junction must evidence a sharp current transition in its current-voltage curve indicating two distinct superconductor gaps. The acceptor tunnel junction can be comprised of a plurality of tunnel junctions in series, or can be comprised of a single tunnel junction. As will become more apparent, the use of multiple junctions in series leads to a device with higher voltage outputs, and one which offers more flexibility in fabrication.

In still other embodiments, this superconducting device can switch from a Josephson current state (i.e., zero voltage state) to a non-zero voltage state. The mode of operation in this embodiment is non-inverting. In another mode of operation, a three-state device can be obtained in which one of the states is a Josephson current state, while the other states are non-zero voltage states. In this latter devices, the acceptor tunnel barrier does not have to be comprised of an insulating material, i.e., it can be a semiconductor, metal, or a semi-metal.

This superconducting device is capable of high gain (greater than about 10), is latching or non-latching (depending upon the biasing), and can be fabricated to provide dense arrays. In the operating modes where Josephson currents are not used, it will not exhibit resonance properties and also has a very low sensitivity to trapped flux. It exhibits high noise immunity and provides high discrimination between output states. The amount of energy required to switch it is extremely low, being of the order of $10^{-17}$ joules.

These and other objects, features, and advantages will be more apparent from the following more particular description of the preferred embodiments.

BRIEF DESCRIPTION OF THE DRAWINGS

FIG. 1.1 shows a known superconductor-insulator-normal metal structure for injection of quasi-particles into the superconductor.

FIG. 1.2 is a curve illustrating the dependence of the superconducting gap on the excess quasi-particle density at T=0°. These curves are based on two models relating the superconducting gap to the excess quasi-particle density n.

FIG. 1.3 is a plot of the current $I_T$ through the superconductor-insulator-normal metal structure of FIG. 1.1 plotted as a function of the voltage $V_T$ across the structure of FIG. 1.1 and the voltage $V_{12}$ measured between two points in the superconducting layer.

FIG. 2.1 shows a structure comprising two superconductors $S_1$ and $S_2$ separated by a thin tunneling barrier, while FIG. 2.2 shows the expected dependence of threshold power density $P_c(\epsilon)$ on injected quasi-particle energy $\epsilon$.

FIG. 3.1 is an illustration of a structure including two superconductors $S_1$ and $S_2$ where quasi-particles are injected into $S_2$, while FIG. 3.2 shows the modification of the current-voltage (I-V) characteristics of the structure of FIG. 3.1 by heavy injection of quasi-particles such that $\Delta_2 \rightarrow 0$.

FIG. 4.1 illustrates a three terminal superconducting switch in accordance with the principles of the present invention in which a single junction acceptor (SJA) has its tunneling characteristics modified by excess injection of quasi-particles, there being a linear load $R_L$ connected across the acceptor junction.

FIG. 4.2 illustrates a superconducting switch in accordance with the present invention wherein two acceptor junctions in series have their tunnel characteristics modified by injection of excess quasi-particles into the acceptor junctions, there being a linear load $R_L$ connected across the series connection of acceptor junctions.

FIG. 4.3 shows the current-voltage (I-V) of the SJA and DJA structures of FIGS. 4.1 and 4.2, and illustrates the "1" and "0" states produced across the resistive load $R_L$.

FIG. 5.1 shows two directly coupled Quiterons, where a first double junction acceptor has as a load a second double junction acceptor. The second DJA provides a nonlinear load to the first DJA, and the current-voltage characteristics of the first DJA are shown in FIG. 5.2.

FIG. 10.1 shows a SJA Quiteron which can be used in a logic circuit, while FIG. 10.2 shows its current-voltage characteristic.

FIG. 11.1 shows a DJA Quiteron which can be used in a logic circuit, while FIG. 11.2 shows its current-voltage characteristics for this application.

FIG. 14.1 shows a three-input NOR circuit using SJA devices, while FIG. 14.2 shows the current-voltage characteristic of this NOR circuit.

FIG. 15.1 shows a three-input NOR circuit using a SJA device which has a multi-injection input (i.e., the injector junction is comprised of a plurality of tunnel junctions).

FIG. 15.2 shows the current-voltage characteristic of the device of FIG. 15.1.

FIG. 20.1 shows a SJA device using a different biasing scheme, while FIG. 20.2 shows the I-V characteristic of the device of FIG. 20.1.

FIG. 21.1 shows a Quiteron device with a linear load, while FIG. 21.2 shows its I-V characteristics, depending on different values of Stewart-McCumber hysteresis parameter $\beta$, and on different values of injected input power P, when the device switches from a Josephson state to another state.

BEST MODE FOR CARRYING OUT THE INVENTION

Figure 6:
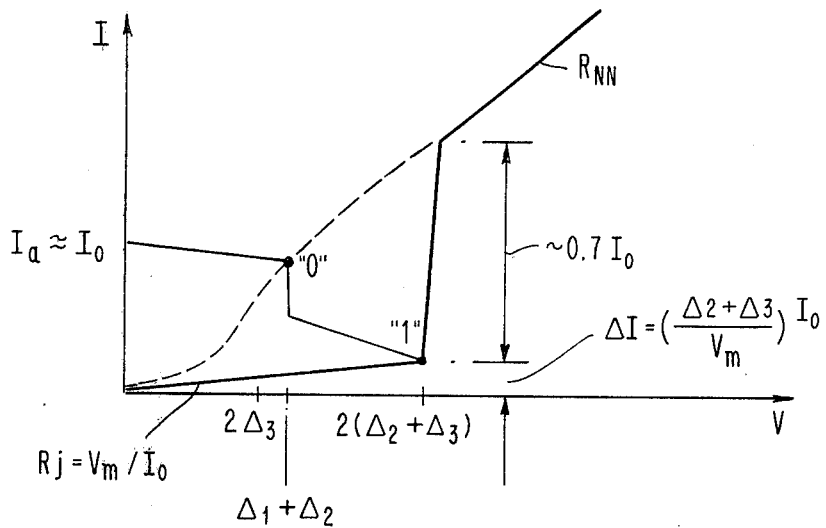
FIG. 6 is another plot of the acceptor characteristics of a first DJA having a second DJA as a non-linear load, and is used to provide the definitions used for the derivation of gain and discrimination ratio, where one DJA Quiteron drives another DJA Quiteron, as shown in FIG. 5.1.

The superconducting devices of the present invention rely on heavy injection of excess energetic quasi-particles to modify the gap $\Delta$ of a superconductor such that $\Delta \rightarrow 0$, thereby greatly altering the tunneling properties of an output (acceptor) tunnel junction. The device is specifically designed to provide sufficient output energy (voltage) to be able to drive another such device in order to change the tunnel characteristics of the driven device. That is, when used as a switch, the device must provide a useful output, where "useful" means that the output exceeds the threshold power of all the driven Quiteron devices in order to switch them to another state. Also, this device can provide inversion and non-latching properties, as well as high gain.

In a general sense, the provision of three terminal devices is desirable from a circuit design standpoint, and the present invention provides such devices. A first tunnel junction (injector junction) is provided for heavy injection of excess energetic quasi-particles into a superconductor which is one electrode of a second tunnel junction (i.e., output or acceptor junction). In addition to electrical excitation, or in lieu thereof, optical, phonon, electron, ion, or neutron excitation, or any combination of these types of excitation can be used to inject excess energetic quasi-particles to make $\Delta \rightarrow 0$. An an example, a three terminal device can use a combination of electrical excitation and optical excitation to significantly change the gap of a superconductor in the device in order to change the tunneling characteristics of the output acceptor junction.

Thus, it is an important feature of the present invention to provide a superconducting device having a useful power output and for this reason the excitation is chosen in order to create a non-equilibrium state in the superconductor whose band gap is greatly modified by the heavy injection of quasi-particles. An excitation mechanism which leaves the superconducting gap near its equilibrium value is not useful when providing switching action in the digital sense (i.e., when providing a sufficient output to drive other similar devices).

Theory of the Invention (FIGS. 1.1, 1.2, and 1.3)

A superconducting strip can be driven normal (resistive) by heating it to its critical temperature $T_c$ or by passing a current through the strip whose density exceeds the critical current density $j_c$. Another technique for driving the superconducting strip normal is to apply an external field greater than the critical field $H_c$. When the superconducting strip is driven from its superconducting state to a resistive state, the superconducting gap $\Delta$ disappears. This is true for both thin and thick superconducting strips, although the change in the gap varies at a different rate depending upon the film thickness. This is the basis for operating the known cryotron switch.

These mechanisms for driving a superconducting strip normal are equilibrium phenomena because the Cooper pairs, quasi-particles, and the phonons involved are in thermal and chemical equilibrium with each other. For equilibrium situations, the energy distributions for the quasi-particles and phonons are given by the Fermi-Dirac and Bose-Einstein statistics, respectively. These equilibrium phenomena are well known in the field of superconductivity, and are explained more completely in the text by M. Tinkham "Introduction to Superconductivity" published by McGraw-Hill, 1975. The excess quasi-particles are created when energies greater than $2\Delta$ are applied so that free electrons and holes are created when the Cooper pairs are split.

It is possible to drive the superconducting strip far from equilibrium by means of overinjection of quasi-particles having energies greater than the gap $\Delta$. The energy gap vanishes as the quasi-particles and phonons assume distributions significantly different from those associated with their thermal equilibrium values. This overinjection of excess quasi-particles causes $\Delta$ to vanish. It is important to note that in this non-equilibrium excitation the films are still in the non-equilibrium superconducting state even though the gap vanishes. This, in turn, greatly modifies the tunneling characteristics of the device, bringing them far from that which would obtain at equilibrium. Still further, heavy injection can lead to a device output $>2\Delta$, which can be used to drive another similar device since it will produce energetic quasi-particles in the driven device.

In FIG. 1.1, a superconducting-insulator-normal conductor structure is shown. A tunnel barrier 10 is located between the normal conductor N and a superconductor S. Barrier 10 can be, for example, an oxide of the normal metal N. A current $I_T$ tunnels through barrier 10 and produces a voltage $V_T$ across the structure. The voltage $V_{12}$ is a voltage measured between points 1 and 2 on the superconductor S.

This SIN tunnel junction is a means by which quasi-particles can be injected into superconductor S. This is a known structure and is used to illustrate the injection of quasi-particles.

The tunneling current $I_T$ creates an excess quasi-particle number density $n = (N - N_T)/4N(0)\Delta(0)$ of energy $eV_T$, where N and $N_T$ are the non-equilibrium and equilibrium quasi-particle number densities, respectively, $N(0)$ is the Bloch density of state, and $\Delta(0)$ is the zero temperature gap. The excess density n increases as the injected power density $P = J_T V_T (J_T = I_T/\text{area})$ is increased until threshold values $P_c$ and $n_c$ are reached such that $\Delta(n_c)$ vanishes. This is illustrated in FIG. 1.2.

FIG. 1.2 shows the dependence of the gap $\Delta$(normalized) on the excess quasi-particle density (normalized) at $T=0°$. The top curve 12 is derived in accordance with the known BCS (T*) model, while the bottom curve 14 is derived from the known Owen-Scalapino $\mu^*$ model.

When the injected power density increases to $P_c = J_{Tc} V_{Tc}$, the voltage $V_{12}$ makes a transition from zero to a finite value. This is indicated in FIG. 1.3, which is a plot of the tunneling current $I_T$ as a function of the voltages $V_T$ and $V_{12}$. Thus, curve 16 applies when $P < P_c$, while curve 18 is for $P > P_c$. The threshold power density $P_c$ and its dependence on injected quasi-particle energy directly affect the characteristics of the Quiteron, since they determine the gain, power dissipation, and speed of this device.

The critical injection current density $J_{Tc}$ can be much smaller than the critical current density $J_c$ of the superconductor S. This distinguishes the non-equilibrium mechanism of the Quiteron and the equilibrium mechanism as far as gap suppression is concerned. The ratio $J_c/J_{Tc}$ is the absolute upper limit of the Quiteron gain. Another distinguishing factor is the speed of the non-equilibrium mechanism, which is much faster than that of the equilibrium mechanism.

As the external excitation is removed, i.e., the quasi-particle injection is stopped ($I_T \to 0$), and the gap recovers its equilibrium value $\Delta$ in a time (relaxation time) governed by several mechanisms. These mechanisms include inelastic scattering, recombination of holes and electrons with the emission of phonons at $\hbar\omega > 2\Delta$, phonon escape from the superconductor, and quasi-particle diffusion. These mechanisms also influence the critical power density.

Threshold Power Density (FIGS. 2.1 and 2.2)

At the critical excess quasi-particle density $n_c(P_c)$, the gap $\Delta$ will vanish. The threshold power density is therefore the density which is required to observe the voltage $V_{12}$. It should be noted that in the transistor of U.S. Pat. No. 4,157,555, the gap $\Delta$ remains at its equilibrium value or very near to it (i.e., the change in $\Delta$ is $<<1\%$) and the voltage $V_{12}$ is not observed. The output voltage of that device is intended to be $<2\Delta$ and its current-voltage characteristics remain substantially the same. In turn, this means that a switching device useful for logic applications cannot be obtained, nor can an amplifier having linearity with large gain.

The following expression has been derived for the threshold power density $P_c$ at $T \simeq 0$:

$$P_c = \frac{4.8e\Delta(0)d}{\pi^2 F \tau} \left( \frac{kT_c}{\hbar c_s} \right)^3 \quad (1)$$

where $c_s$ is the speed of sound, F is the fraction of energy converted to quasi-particles, d is the thickness of the electrode $S_2$, e is the charge of an electron, $T_c$ is the critical temperature, k is the Boltzman constant, and $\tau$ is the thermalization time. The parameter d has a lower limit set by the coherence length and the proximity effect which tend to decrease the gap from its bulk value. The thermalization time $\tau$ also depends on the thickness through the phonon escape mechanism from the film into the surroundings.

It is known that $P_c$ does not change as a function of injected voltage $V_{Tc}$, which is a valid assumption for $V_{Tc} >> 2\Delta$. This has been experimentally verified in lead-tin junctions over a wide voltage range. The dependence of $P_c$ on the injected quasi-particle energy is expected to rise very sharply at the normalized quasi-particle energy $\epsilon = eV_{Tc}/(\Delta_1 + \Delta_2)$, as shown in FIG. 2.2 for two superconductors $S_1$ and $S_2$ having gaps $\Delta_1$ and $\Delta_2$, respectively. This structure and the tunnel barrier 20 therebetween are shown in FIG. 2.1.

The film $S_2$ is thin enough that its gap $\Delta_2$ vanishes at $P_c$, while superconductor $S_1$ is much thicker and consequently is not affected by $P_c$. The sharp rise of $P_c$ at $\epsilon \sim 1$ is expected to occur due to the very sharply peaked densities of states at the gap edges of both materials. At $\epsilon < 1$, $P_c$ saturates to the thermal power density $P_T \equiv P_c(0)$, because the only phonons that will destroy superconductivity are those provided by heating the film to $T_c$. The other extreme, $\epsilon > 1$, exhibits a value $P_c(\infty)$ which takes the value given by Equation (1). In this case, the injected quasi-particles recombine with the emission of phonons at energies greater than $2\Delta_2$, which in turn break pairs in a time faster than they can escape from the film. At $T=0$, $P_c$ is expected to rise sharply to a value $P_T(0) = 25.6 \, d/\tau$ watt/cm$^2$, for lead, where d is in angstroms and $\tau$ is in picoseconds.

The discovery of the $P_c$ vs. $\epsilon$ threshold relationship shown in FIG. 2.2 led to the recognition that a digital switch with an inversion property could be conceived in which the output would be sufficient to drive other similar switches, and which would exhibit high gain. This invention restricts the current density of the injector such that $P_c$ is reached at output voltages of approximately $2(\Delta_2 + \Delta_3)$. This determines the choice of device materials, film thickness, and operating temperature in order to realize an inverting device having sufficient gain and capable of switching similar devices. The $P_c$ vs. $\epsilon$ relationship is not suggested from the prior art, and particularly from U.S. Pat. No. 4,157,555. The device of that patent is restricted in output voltage, current levels, and choice of materials such that the gap is not affected. Therefore, the advantages of high gain, etc. are not possible.

The importance of the power in the Quiteron action is that it is a threshold quantity, i.e., when $P_c$ is reached the gap vanishes. Large currents alone, or large voltages alone, do not necessarily cause the gap to vanish. An excessive amount of current will be required if an equilibrium phenomenon is relied upon. In this situation, the critical current of the film itself must be exceeded and no pair breaking will occur until the critical current is exceeded. However, in the non-equilibrium situation caused by heavy injection of high energy quasi-particles, less power is required to have the gap $\Delta$ to vanish to 0 in accordance with the relation shown in FIG. 2.2. The amount of voltage which is applied is sufficient to observe pair breaking, the minimum voltage being $2\Delta$. The applied voltage is chosen to be sufficient to sustain the gap at $\Delta = 0$ as long as that is required. Thus, voltages are applied such that Cooper pairs break, and so that the gap vanishes. Relatively lower injected current and relatively lower voltage [$\gtrsim (\Delta_1 + \Delta_2)$] result in small power capable of making $\Delta_2 \to 0$. The energy of the injected quasi-particles and the number injected is sufficient to make a significant change in the gap $\Delta$. Non-equilibrium phenomena are utilized, and the output voltages are sufficiently high that similar Quiteron-type devices can be driven.

I-V Characteristics (FIGS. 3.1 and 3.2)

FIG. 3.1 shows a structure comprising first and second superconductors $S_1$ and $S_2$, having gaps $\Delta_1$ and $\Delta_2$, respectively, and separated by a tunneling barrier 22. A tunnel current I flows through the tunnel barrier, and a voltage V is established across the barrier.

The current-voltage (I-V) characteristics of the tunnel junction in FIG. 3.1 are shown in FIG. 3.2. The solid curve 24 is that due to an equilibrium state where $P << P_c$. As will be more apparent later, curve 24 must be one in which a current transition occurs at $\Delta_1 + \Delta_2$. This feature is required for the equilibrium I-V characteristic of the acceptor junction. The dashed curve 26 corresponds to that which occurs when P is greater than $P_c$ (i.e., $\Delta_2 \to 0$). The modified non-equilibrium curve 26 resembles that of a normal-superconductor junction which has a sharp current rise at $V = \Delta_1$.

When the threshold power density $P_c$ is achieved, the I-V characteristic changes from curve 24 to curve 26.

When P is removed, the tunnel device switches back to the I-V curve 24. The ability to switch back and forth between curves 24 and 26 is referred to as the Quiteron action. This action can be achieved by the following different external excitations:

1. Creation of quasi-particles in electrode $S_2$ by photons having energies larger than $2\Delta_2$ such that Cooper pairs can be broken.
2. Phonon beams with $\hbar\omega > 2\Delta_2$.
3. Injection of quasi-particles by means of another tunnel junction.
4. Electron, ion, and neutron beam.

In FIG. 3.1, the arrows 28 represent the application of injected quasi-particles into superconductor $S_2$, as for example by photon beams.

Quiteron Embodiments (FIGS. 4.1, 4.2, and 4.3)

The Quiteron devices of FIGS. 4.1 and 4.2 illustrate embodiments wherein the injection of quasi-particles is by means of another tunnel junction, which will be called the injector junction. As an alternative the injector could be a weak link device. In FIG. 4.1, the output junction (acceptor junction) is comprised of a single junction and the device is termed a single junction acceptor (SJA). In FIG. 4.2, the output junction is comprised of two junctions in series and the device is called a double junction acceptor (DJA). As will be seen later, the design of the DJA has advantages over the SJA design, particularly in the choice of the electrodes, and in the greater output voltage that can be obtained.

In FIG. 4.1, the Quiteron device 30 is comprised of three superconducting films $S_1$, $S_2$, and $S_3$, having gaps $\Delta_1$, $\Delta_2$, and $\Delta_3$, respectively. As will be seen later, maximum discrimination between binary 1 and 0 states, and the ability to drive other devices, occurs if certain relationships exist between $\Delta_1$, $\Delta_2$, and $\Delta_3$. Adjustment of these gaps relative to one another also affects the gain that can be obtained.

Middle electrode $S_2$ is made thin enough so that its gap $\Delta_2$ can be suppressed to zero when the threshold power density $P_c$ is exceeded. Films $S_1$ and $S_3$, on the other hand, are thick enough to prevent them from going normal when $P_c$ is exceeded.

A tunnel barrier 32 is formed between $S_1$ and $S_2$, and a second tunnel barrier 34 is formed between $S_2$ and $S_3$. Tunnel junction 32 is termed the "injector" junction since its function is to inject quasi-particles into superconductor $S_2$. Junction 34 is termed the "acceptor" junction since its tunneling characteristics will be modified depending upon the injection of quasi-particles into $S_2$.

In the operation of this device $S_1$ can be a non-superconductor (i.e., normal) or it can go normal, without adversely affecting device operation. $S_2$ must be a superconductor whose gap can be drastically reduced, and is sufficiently thin that a reasonable input power can be used to do that. $S_3$ is preferably a thicker superconductor, since the device is faster if only $S_2$ has its gap drastically changed when $P > P_c$ is applied. If $S_3$ stays superconducting, then two distinct states are achieved and only $S_2$ has to return to its original $\Delta_2$ state when the input power is removed. This means that switching between the different output states will be faster.

In FIG. 4.1, electrode $S_3$ is a continuous electrode across the entire lateral extent of barrier 34. Thus, the device is a single junction acceptor.

The injector and acceptor junctions are biased with DC current sources $I_i$ and $I_a$, and a load $R_L$ is connected across the acceptor junction formed by electrodes $S_2$ and $S_3$ having tunnel barrier 34 therebetween. The voltage across $R_L$ is $V_L$.

FIG. 4.2 shows a double junction acceptor in which two acceptor junctions are in series. In this device, superconductors $S_1$, $S_2$, and $S_3$ are provided having gaps $\Delta_1$, $\Delta_2$, and $\Delta_3$, respectively. $S_1$ and $S_2$ are separated by a tunnel barrier 36, while superconductors $S_2$ and $S_3$ are separated by tunnel barrier 38. $S_2$ is sufficiently thin that its gap $\Delta_2$ can be suppressed to zero when $P_c$ is exceeded, while films $S_1$ and $S_3$ are sufficiently thick that they will not go normal when $P_c$ is applied. The same considerations with respect to $S_1$, $S_2$, and $S_3$ described for the SJA structure of FIG. 4.1 apply to the structure of FIG. 4.2. The DC bias sources $I_i$ and $I_a$ are also the same as those described with respect to FIG. 4.1, as is the linear load $R_L$.

In the embodiment of FIG. 4.2, the acceptor junction is comprised of two tunnel junctions in series. One of these is formed between $S_3$ and $S_2$, while the other is formed between $S_3'$ and $S_2$. As was previously mentioned, the use of at least two junctions in series for the acceptor junction leads to a Quiteron whose output voltage is $>(\Delta_1+\Delta_2)$ and hence it can drive another Quiteron device. In the SJA, greater constraints exist on the electrode materials in order to achieve the same results.

FIG. 4.3 shows the current-voltage characteristics (I-V) of the Quiterons of FIGS. 4.1 and 4.2 across the linear resistive load $R_L$. When the injector bias $I_i = 0$, the load intersects the solid I-V curve 40 at a load voltage $V_L^1 = 2(\Delta_2 + \Delta_3)$. This represents the binary state "1" of the output current $I_L$ through $R_L$.

If the injection current $I_i$ is increased such that the injected power $P_i = I_iV_i$ exceeds the threshold power $P_c$x area, the gap $\Delta_2$ will vanish and the load line will intersect the dashed curve 42 at a load voltage $V_L^0 \approx 2\Delta_3$. This is the "0" binary state of the Quiteron. Thus, the Quiteron can be used as an inverter, which is a feature exhibited by transistors. It operates in a non-latching mode because it can be switched back to the "1" state when $P_i \to 0$ (i.e., it does not stay in the $V_L^0$ state when $P_i \to 0$).

In the practice of this invention, it is important that the acceptor junction exhibit an equilibrium I-V curve which has a current transition at $V = \Delta_2 + \Delta_3$, i.e., it must exhibit a two gap characteristic. For this reason, the acceptor tunnel barrier is generally an insulating material, such as an oxide of $S_2$. The injector tunnel barrier can be more arbitrarily selected and can be, for instance, a normal metal, a semi-metal, an insulator, a semi-conductor, etc. Although layered structures have been shown for the SJA and DJA devices, other geometries can be used. For example, the acceptor junction and/or the injector junction can be an edge junction.

Directly Coupled Quiterons (FIGS. 5.1 and 5.2)

For a useful device, it must be possible to apply the output of one Quiteron to drive another Quiteron, so that circuits comprising a plurality of Quiterons can be formed. It is a primary object of this invention to describe such a device, in order to provide useful logic and amplifier circuits.

FIG. 5.1 shows two directly coupled DJA Quiterons. In this circuit, the output of the first Quiteron 44 is used to drive the input of the second Quiteron 46. The injector junction of Quiteron 46 represents a nonlinear load to the output of Quiteron 44. As will be more apparent with respect to FIG. 5.2, this provides a nonlinear load line leading to a circuit having very good discrimination between different output states.

In more detail, Quiteron 44 is comprised of electrodes $S_1$, $S_2$, and $S_3$, having superconducting gaps $\Delta_1$, $\Delta_2$, and $\Delta_3$, respectively. Tunnel barrier 48 is provided between $S_1$ and $S_2$, while tunnel barrier 50 is provided between $S_2$ and $S_3$, as well as between $S_2$ and $S_3'$. Typically, $S_3$ and $S_3'$ are comprised of the same material.

Quiteron 46 is also comprised of three electrodes having the same designations $S_1$, $S_2$, and $S_3$. The superconducting gaps are $\Delta_1$, $\Delta_2$, and $\Delta_3$. Superconductor $S_3'$ is typically the same as $S_3$, and therefore also has the gap $\Delta_3$. Tunnel barriers 52 and 54 are provided in the same manner as tunnel barriers 48 and 50.

In a typical circuit, the materials comprising electrodes of Quiteron 46 will be the same as the material providing the electrodes in Quiteron 44. Additionally, the tunnel barriers 48 and 50 will be comprised of the same material as tunnel barriers 52 and 54, and will be formed at the same time.

A current $I_I$ is provided to the injector of Quiteron 44, and is designated as input A. Since the Quiteron is an inverter, the output of Quiteron 44 is $\overline{A}$. The acceptor junction 50 of Quiteron 44 is biased with DC current $I_{a1}$ while the acceptor junction 54 of Quiteron 46 is biased with DC current $I_{a2}$. A load 56 is provided across Quiteron 46.

It is possible for Quiteron 44 to drive Quiteron 46 since the gain of Quiteron 44 is sufficiently high that its output power in the "1" state, $P_1$, exceeds the threshold power of Quiteron 46, while that of the "0" state, $P_0$, does not. Quiteron 46 represents a nonlinear load to Quiteron 44 and this results in a significant increase in the discrimination ratio $D \equiv P_1/P_0$ between the "1" and "0" states. In order to take full advantage of this nonlinear loading, the condition $2\Delta_3 < \Delta_1 + \Delta_2 < 2(\Delta_2 + \Delta_3)$ is satisfied.

The discimination ratio is then given by:

$$D = \left(\frac{\Delta_2 + \Delta_3}{\Delta_3}\right)^2 (R_j/R_{NN}) \text{ injector} \quad (2)$$

$$= \left(\frac{\Delta_2 + \Delta_3}{\Delta_3}\right)^2 [1 + 1.43 \, V_m/(\Delta_1 + \Delta_2)]$$

where $R_j$, $V_m$, $R_N$, N are defined in FIG. 6, and $I_0 \approx 0.7 (\Delta_2 + \Delta_3)/R_{NN}$. $R_{NN}$ is the normal tunnel resistance, and $V_m$ describes the quality of the junctions which ranges between 25 mV and 50 mV for lead alloy junctions. The leakage current $$\Delta I \cong \frac{(\Delta_2 + \Delta_3)}{V_m} I_0$$

is preferred to be as low as possible, and $R_j = V_m/I_0$.

FIG. 5.2 shows the I-V characteristics of the acceptor junction 50 with the nonlinear load represented by Quiteron 46. The solid curve 58 is the curve followed when the input excitation to Quiteron 44 is less than the threshold power density, while the dashed curve 60 is the I-V characteristic when the threshold power density of Quiteron 44 is exceeded such that $\Delta_2$ vanishes. The load line has two portions: A first portion 62 representing a high resistance and a second portion 64 representing a lower resistance. The binary "1" state occurs where the load line intersects solid curve 58, while the "0" state occurs where the load line intersects dashed curve 60.

Figure 7:
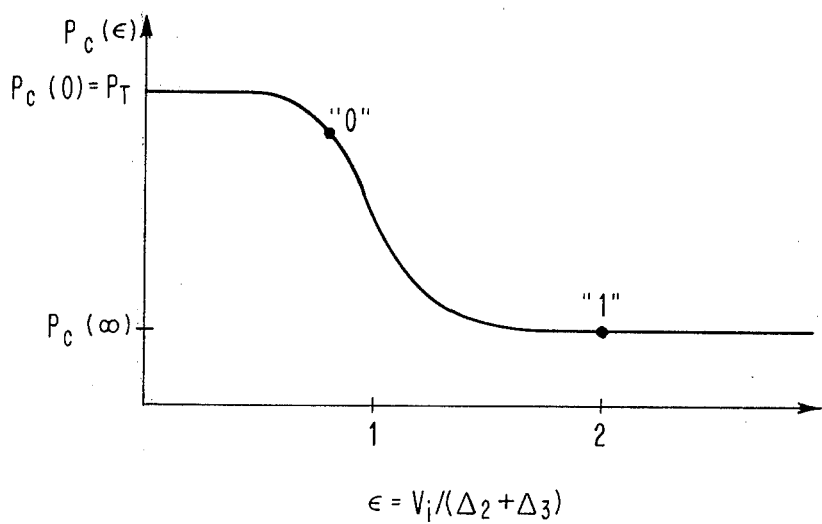
FIG. 7 is another plot of power density $P_c$ as a function of injected quasi-particle energy $\epsilon$, showing the location of the binary states of the Quiteron, thereby indicating the enhancement of discrimination between the "1" and "0" states.

Discrimination Enhancement (FIGS. 6 and 7)

FIG. 6 is a I-V plot of the acceptor characteristics of Quiteron 44 when the load for this Quiteron is a nonlinear load, and in particular is Quiteron 46. FIG. 6 is essentially the same as FIG. 5.2, except that it is used to define the parameters which are used to derive the expressions for the discrimination ratio (Equation 2) and for the gain of the device (Equation 7). As was described with respect to FIG. 5.2, $2\Delta_3$ is less than $\Delta_1 + \Delta_2$, which in turn is less than $2(\Delta_2 + \Delta_3)$. The binary "1" state is $V_L^1 = 2(\Delta_2 + \Delta_3)$, while the binary "0" state is $V_L^0 = \Delta_1 + \Delta_2$.

FIG. 7 is a plot of the threshold power density $P_c$ as a function of the normalized quasi particle energy $\epsilon = V_i/(\Delta_2 + \Delta_3)$. FIG. 7 shows the location of the binary states with respect to the threshold power density curve, and is used to indicate the enhancement of discrimination when a nonlinear load is applied to Quiteron 44. The binary "0" state is at $\epsilon_0 = 2\Delta_3/(\Delta_2 + \Delta_3) < 1$, while the binary "1" state is at $\epsilon_1 = 2$. Equation 2 for the discrimination factor D has to be multiplied by the ratio $P_c(0)/P_c(\infty)$ to obtain $$D = \frac{P_c(0)}{P_c(\infty)} \left(\frac{\Delta_2 + \Delta_3}{\Delta_3}\right)^2 [1 + 1.43 \, V_m/(\Delta_1 + \Delta_2)]. \quad (3)$$

For $P_c(0)/P_c(\infty) = 23.8$, and for $V_m = 30$ mV, $\Delta_1 = \Delta_2 = 1.2$ $\Delta_3 = 1.36$ mV, D = 1932.

The fact that discrimination occurs between power levels instead of between either voltage alone or current along is a unique feature of the Quiteron. This has a significant impact on noise immunity, which can be described by a noise discrimination ratio $D_N$:

$$D_N = \frac{P_c(0)}{P_c(\infty)} \frac{P_1}{P_{Noise}} = 4 \frac{P_c(0)}{P_c(\infty)} \left(\frac{\Delta_2 + \Delta_3}{V_N}\right)^2 \frac{Z_0}{R_{NN}} \quad (4)$$

where $V_N$ is the cross-talk noise induced in the line of impedance $Z_0$. For example, if $V_N = \Delta_2 + \Delta_3$ and $Z_0 = R_{NN}$, $D_N$ as high as 96 may be obtained.

The Quiteron devices do not require the presence of Josephson tunneling current through the tunnel barriers. Therefore, resonance problems do not arise and these devices are not ultrasensitive to trapped flux. However, Josephson current can be present, as will be explained with respect to the embodiments of FIGS. 21.1, 21.2, 22, and 23.

Gain

The power gain G of the Quiteron is the ratio of the output power across the load $P_L = 2 I_a (\Delta_2 + \Delta_3)$ to the injected threshold power $P_c A_i$ where $A_i$ is the injector junction area. This gain is given by the following expression:

$$G = \frac{2I_a(\Delta_2 + \Delta_3)}{P_c A_i} \quad (5)$$

Let $I_a \approx \frac{1}{2} j_a A_a$, and $P_c = 4 j_i (\Delta_2 + \Delta_3)$, and assuming that $j_i$ is approximately $\frac{1}{2} j_{TC}$ and $D_{TC} = 2(\Delta_2 + \Delta_3)$, the gain can be rewritten as $$G = (A_a/A_i)(j_a/4j_i) \quad (6)$$

The acceptor current density $j_a$ and the injector current density $j_i$ are measured at the same voltage $(\Delta_2+\Delta_3)$. Equation 6 indicates that by increasing the current density ratio it is possible to obtain $G\gg1$. It also indicates that the gain does not depend on the lateral dimensions of the Quiteron, but instead depends upon the tunnel barrier thicknesses.

Hence, the Quiteron device is potentially miniaturizable. For example, for $j_a/j_i=100$, the tunnel barrier thicknesses of the acceptor and injector barriers differ by merely 3 angstroms. In the Quiteron, the ratio $J_a/J_i$ is not arbitrarily chosen; instead, $j_i$ is chosen such that $J_i(\Delta_1+\Delta_2)\approx P_c$. Gain is then defined after the threshold is reached. In contrast with this, the ratio $j_a/j_i$ in the transistor of U.S. Pat. No. 4,157,555 is arbitrarily chosen.

Gains of 10 are easily realized using lead based alloy electrodes and an acceptor junction area which is ½ the injector junction area, and for $j_a=14,600$ A/cm². If the ratio $j_a/j_i$ is increased, more gain is possible. Since tunnel current densities as high as $2\times10^5$ A/cm² have been realized in lead alloys, this seems possible. However, there are fundamental limitations which fix the maximum gain $G_{max}$. For example, it is desirable to keep $j_a$ low enough that $\Delta I(\Delta_2+\Delta_3)\approx P_c(1)$, using the I-V characteristic of FIG. 6. $G_{max}$ is given by the following expression:

$$G_{max} = \frac{2I_a(\Delta_2+\Delta_3)}{\Delta I(\Delta_2+\Delta_3)}\frac{P_c(0)}{2P_c(\infty)} \quad (7)$$

It has previously been mentioned that it is advantageous to fabricate the acceptor from at least two junctions in series rather than from only one junction (SJA). One reason for this is the following. More flexibility is obtained in choosing the superconducting materials used for the electrodes in the case of a DJA than for an SJA because of the conditions imposed on the gaps. These conditions are $2\Delta_3<\Delta_1+\Delta_2<2(\Delta_2+\Delta_3)$ for a double junction acceptor, and $\Delta_3<\Delta_1+\Delta_2<\Delta_2+\Delta_3$ for a single junction acceptor. For example, the convenience of using three identical superconductors $\Delta_1=\Delta_2=\Delta_3$ is possible in a double junction acceptor while still benefiting from the ratio $P_c(0)/P_c(\infty)\gg1$. This ratio enters into the discrimination ratio expression given in Equation 3, and in the noise immunity Equation 4, as well as in the expression for maximum gain (Equation 7). In contrast with this, it is not possible to benefit from the ratio $P_c(0)/P_c(\infty)$ when $\Delta_1=\Delta_2=\Delta_3$ in the single junction acceptor Quiteron. Still further, the output voltage of the DJA is $2(\Delta_2+\Delta_3)$, while for the SJA it is $(\Delta_2+\Delta_3)$. The SJA benefits from the ratio $P_c(0)/P_c(\infty)$ if the constraint $\Delta_3\approx\Delta_1+\Delta_2<\Delta_2+\Delta_3$ is imposed.

Miniaturization

Since the gain as given by Equation 6 does not depend upon the lateral dimensions of the Quiteron, advanced lithographic techniques and processes can be used to miniaturize these devices. At small line widths, the gain will be affected by the quasi-particle diffusion length. Since the operation of this device is based on overinjection of quasi-particles, the diffusion length decreases to about 1,000 angstroms, which is assumed to fix the smallest line width.

Speed

The non-equilibrium phenomena used to change the state of this device provides quite high switching speeds. In particular, superconductors having high $T_c$, and their alloys, should have the shortest quasi-particle relaxation times. The most dominant relaxation processes are recombination to form a bound Cooper pair with the emission of a phonon, and inelastic scattering with phonons. The recombination times and inelastic times become shorter at higher energies, which further proves the significance of the double junction acceptor embodiment. With over-injection of quasi-particles, there is an enhanced probability for recombination, which in turn produces more phonons to engage in the inelastic scattering process. If these phonons are sufficiently energetic, they will break additional Cooper pairs, to create even more quasi-particles. This helps to sustain the gap at $\Delta=0$.

Power Dissipation

From a power dissipation point of view, it appears that very low switching energies are required to change the state of the Quiteron. The absolute power dissipation per bit drops rapidly as $1/W^2$ for these devices, where W is the linewidth. For example, if a device has a switching speed less than about 100 psec., then at $W=1$ micrometer, approximately $6\times10^{-18}$ joules (gain=1) will be required to switch from one binary state of the device to the other.

Figure 8:
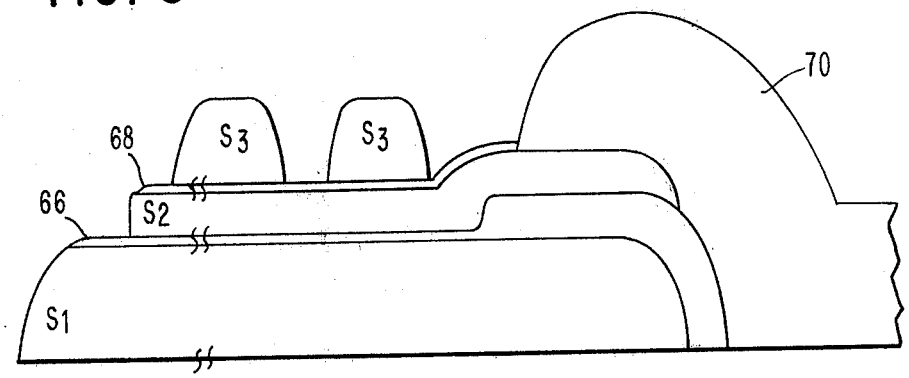
FIG. 8 illustrates a scheme for making electrical contact to the thin superconducting electrode $S_2$ whose gap is greatly modified by the introduction of excess quasi-particles. A DJA structure is shown in this side view.
Figure 9:
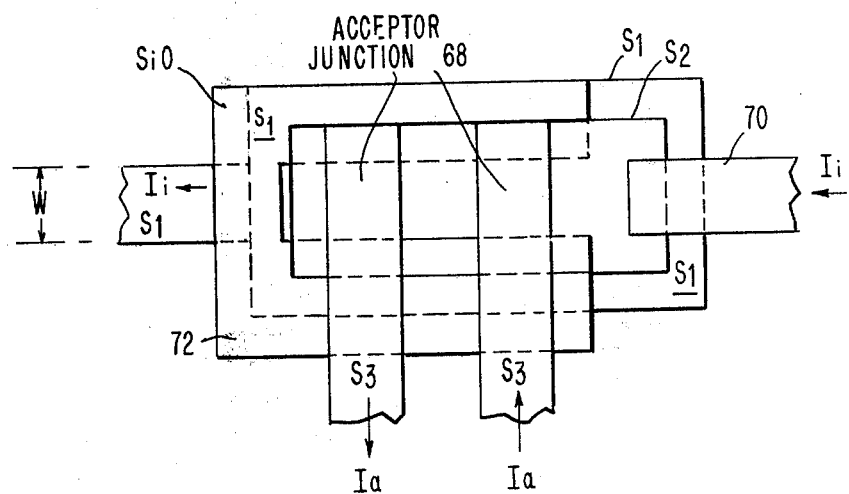
FIG. 9 is a top view of the DJA structure of FIG. 8, showing a possible layout of this Quiteron device, where the superconducting layers are $S_1$, $S_2$, and $S_3$.

Fabrication (FIGS. 8 and 9)

The three electrode devices shown herein use a very thin superconductor $S_2$ whose gap is modified by over-injection of quasi-particles. Electrical contact must be made to this very thin electrode. Additionally, the electrodes $S_1$ and $S_3$ are thicker, and this means that the thin middle electrode $S_2$ has to step down a thick electrode $S_1$. FIG. 8 shows a scheme for making electrical contact to the thin electrode $S_2$.

In more detail, FIG. 8 shows the electrodes $S_1$, $S_2$, and $S_3$, which are separated by the injector barrier 66 and acceptor barrier 68. As is apparent, the injector junction 66 is thinner in the region where the Quiteron action occurs, but is thicker in the region where electrical contact is to be made to $S_2$. The thick metallurgical layer 70 is used to contact $S_2$. If desired, acceptor barrier 68 can be formed from an insulator which is thicker in the region outside of electrodes $S_3$ in the same manner that the injector barrier is thicker outside the device area. This will further ensure that there is no undesired electrical contact between conductor 70 and $S_3$.

FIG. 9 shows a top view of a layout for a double junction acceptor device such as that in FIG. 8. The bottom electrode is $S_1$, while the thin middle electrode is $S_2$. The top electrode is $S_3$. The additional thick metallurgy layer 70 is used to make contact to thin electrode $S_2$ and is shown in the side view of FIG. 8. The acceptor junction 68 is a double junction, while the injector junction 66 is formed between $S_1$ and $S_2$. The injector current flows into contact strip 70 and out of $S_1$. Layer 72 is an insulating layer which electrically insulates $S_1$ from $S_3$. It is, for example, a layer of SiO.

In FIG. 9, W is the minimum linewidth. Thus, this device layout occupies an area 21 $W^2$. This represents an improvement in density over the holey and stepped interferometers of the prior art. One disadvantage of the Quiteron is in the required control of the current densities $j_i$ and $j_a$ to within reasonable tolerances. However, this disadvantage may be rendered less severe due to the availability of gain, large discrimination factor, and high noise immunity.

Applications of Quiteron

This device has applications in digital systems, analog systems, and in the study of the physics of non-equilibrium superconductivity. The technology necessary to make superconductive tunneling devices, such as Josephson tunneling devices, can be used to fabricate circuits of Quiterons. The following sections will describe the use of these devices in logic circuits, and as analog amplifiers.

Quiteron Logic Circuits (FIGS. 10.1, 10.2, 11.1, 11.2, 12-18)

As will be apparent from the following, NOR logic circuits can be built using these devices. This provides advantages in fabrication/density/scaling over the Josephson device circuits, in which AND, OR, and INVERT blocks are needed to design complete logic circuits. Because the Quiteron is an inverting device, a NOR block can easily be designed, and this can be used to build a complete family of logic circuits. For this application the SJA configuration is more suitable than the DJA configuration. However, the DJA configuration has an advantage from the fabrication and metallurgical points of view. These configurations can be combined in a single circuit, as will be apparent from the full adder of the FIG. 17.

The ratio $\eta = P(0)/P(\infty) >> 1$ has been mentioned to enhance the maximum gain, the discrimination ratio, and the noise immunity. In order to take advantage of $\eta$, certain constraints are applied to $\Delta_1$, $\Delta_2$, and $\Delta_3$ for both the SJA and DJA devices. For the SJA device $\Delta_3 \leq \Delta_1 + \Delta_2 < \Delta_2 + \Delta_3$, while for the DJA device $2\Delta_3 \leq \Delta_1 + \Delta_2 < 2(\Delta_2 + \Delta_3)$.

FIG. 10.1 shows an SJA configuration, while FIG. 10.2 shows its I-V characteristic. The ratio of the 1 voltage state to the 0 voltage state is $V(1)/V(0) = (\Delta_2 + \Delta_3)/(\Delta_1 + \Delta_2)$. These voltages are indicated in FIG. 10.2 for the SJA device having an injector current $I_i$ and an acceptor bias current $I_a$. The injector junction 74 is located between $S_1$ and $S_2$ while the acceptor junction 76 is located between $S_2$ and $S_3$. A nonlinear load 78 is connected across the acceptor junction and can be, for example, another SJA device.

Since $\Delta_1 + \Delta_2 \sim \Delta_3$, $V(1)/V(0)$ is approximately $(\Delta_2/\Delta_3) + 1 \geq 1.5$, $\Delta_2/\Delta_3$ is at least equal to or greater than 0.5. Three different superconductors, preferably with $T_c > 4.2°$ K., are therefore necessary. Table I lists possible sets of superconductors that may be used to implement the SJA configuration.

tion over the SJA configuration and therefore, the three superconductors can be the same for the DJA device. If $\Delta_1 = \Delta_2 = \Delta_3$, $V(1)/V(0) = 2$.

Figure 12:
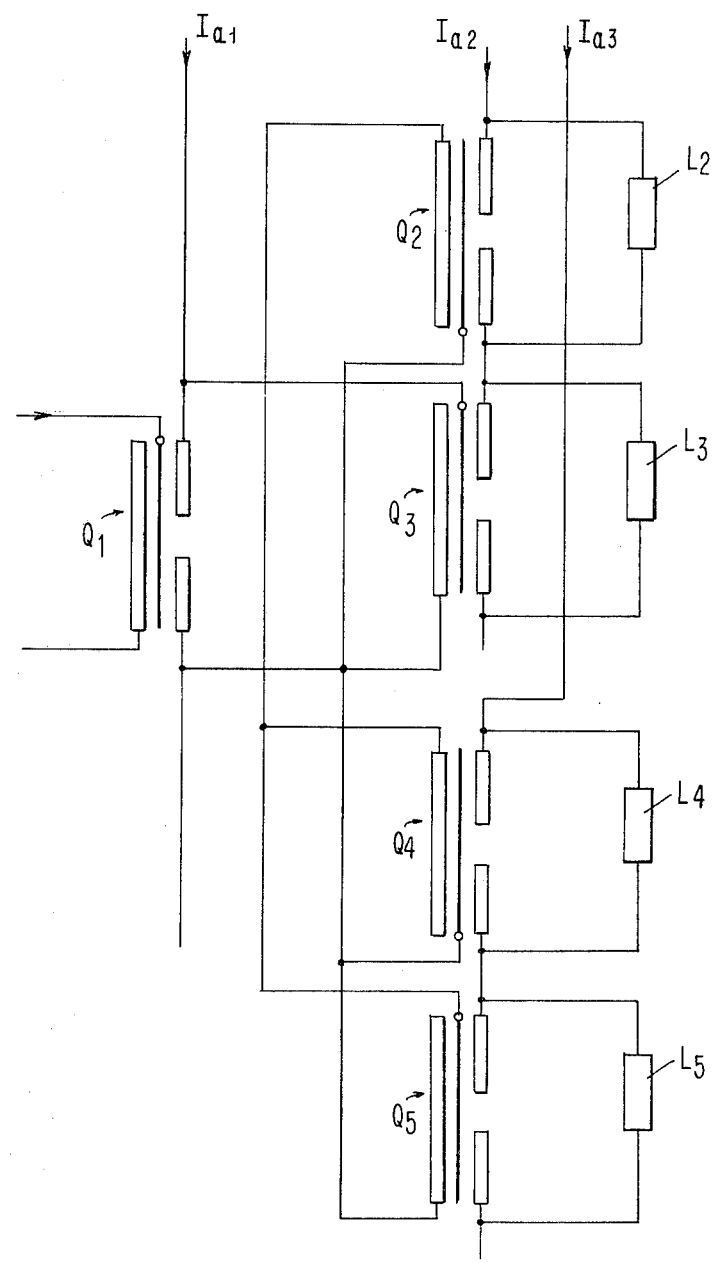
FIG. 12 shows a DJA Quiteron circuit powered by current sources $I_{a1}$, $I_{a2}$, and $I_{a3}$, in order to obtain a fan-out of four.

FIG. 12 shows DJA devices powered by current sources $I_{a1}$, $I_{a2}$, and $I_{a3}$ in order to obtain a fan-out of four. The DJA Quiterons are shown schematically, and are labelled $Q_1$, $Q_2$, $Q_3$, $Q_4$, and $Q_5$. The loads $L_2$, $L_3$, $L_4$, and $L_5$ are connected across devices $Q_2$-$Q_5$, respectively.

It would be ideal to string DJA devices in series by means of a single current source. However, because of undesirable current leakage paths, a multiplicity of current sources is required, as shown in FIG. 12. Each device is restricted to have a fan-out of two for each different current source. For example, device $Q_1$ drives the two devices $Q_2$ and $Q_3$ powered by $I_{a2}$, and drives devices $Q_4$ and $Q_5$ powered by $I_{a3}$, thus providing a total fan-out of four. This powering scheme is of limited utility because only simple logic functions can be implemented. An undesirable number of current sources is necessary in order to implement more complex functions.

Figure 13:
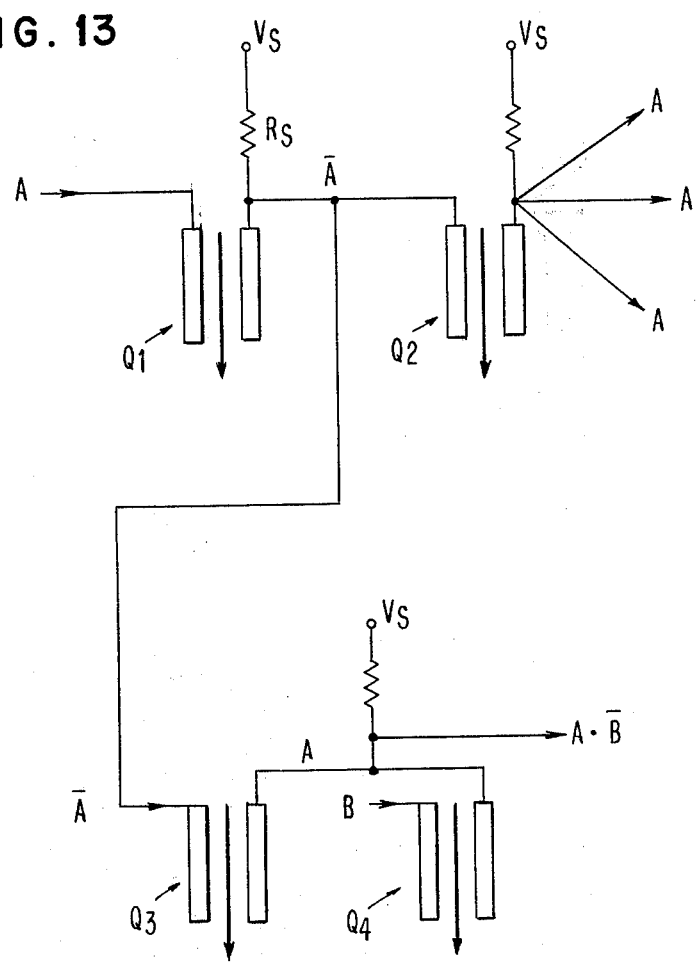
FIG. 13 illustrates SJA Quiteron parallel powered logic circuits. This SJA Quiteron configuration avoids isolation problems encountered by DJA Quiteron circuits such as those in FIG. 12.

The SJA device configuration avoids the isolation problems encountered by the DJA device. This occurs because the center electrode is grounded, and hence current return paths to the input are eliminated. For example, FIG. 13 illustrated a parallel powering scheme which requires a single voltage bus $V_s$ and a power resistor $R_s$ for each device. This scheme dissipates more power than a series connected DJA configuration, but takes better advantage of Quiteron density. The power resistor $R_s$ can be made with a suitable tunnel junction, especially since the supply voltage $V_s$ is a DC voltage.

In FIG. 13, device $Q_1$ has an injector input A, and will provide an acceptor output $\overline{A}$ when A exceeds the threshold power density. Only when input $\overline{A}$ is present to device $Q_2$ will the outputs A be realized from $Q_2$.

$\overline{A}$ is also an input to device $Q_3$. Its output will be A, which is provided to the acceptor electrode of device $Q_4$. Only when input B is present to $Q_4$, will the output $\overline{B}$ be provided from $Q_4$. Thus, the presence of $\overline{A}$ to $Q_3$ at the same time that B is provided to $Q_4$ is required to produce the output A·$\overline{B}$.

FIG. 14.1 shows a three input NOR circuit with Quiterons $Q_1$, $Q_2$, and $Q_3$. A single voltage bus delivers

TABLE I

| SET NO. | $S_1$ | $\Delta_1$ | $T_{c1}$ | $S_2$ | $\Delta_2$ | $T_{c2}$ | $S_3$ | $\Delta_3$ | $T_{c3}$ |
|---|---|---|---|---|---|---|---|---|---|
| 1 | PbTe | 1.19 | 6 | Nb | 1.525 | 9.2 | Nb$_3$Sn | 3.25 | 17.2 |
| 2 | PbTe | 1.19 | 6 | Nb$_3$Sn | 3.25 | 17.2 | Nb$_3$Ge | 4.08 | 21.55 |
| 3 | Pb | 1.36 | 7.2 | Nb | 1.525 | 9.2 | Nb$_3$Sn | 3.25 | 17.2 |
| 4 | Nb | 1.525 | 9.2 | Nb$_3$Sn | 3.25 | 17.2 | Nb$_3$Ge | 4.08 | 21.55 |
| 5 | Nb | 1.525 | 9.2 | Nb | 1.525 | 9.2 | Nb$_3$Sn | 3.25 | 17.2 |
| 6 | Nb | 1.525 | 9.2 | Nb | 1.525 | 9.2 | Nb$_3$Ge | 4.08 | 21.55 |

FIG. 11.1 shows a DJA configuration, while FIG. 11.2 gives its I-V characteristics and indicates the voltages when the device is in its 0 and 1 states. The injector junction 80 is located between $S_1$ and $S_2$, while the acceptor junction 82 is located between $S_2$ and $S_3$. A nonlinear load 84, preferably another DJA configuration, is connected across the acceptor. $I_i$ provides DC bias to the injector junction, while $I_a$ provides DC bias to the acceptor junction.

In order to take advantage of the discrimination when a nonlinear load is used, $2\Delta_3 \leq \Delta_1 + \Delta_2 < 2(\Delta_2 + \Delta_3)$. Thus, $V(1)/V(0)$ is $2(\Delta_2 + \Delta_3)/(\Delta_1 + \Delta_2)$. The DJA configuration has a factor of two advantage in discriminathe power $V_s$ through a resistor $R_s$. Thus, acceptor current $I_a$ flows to each of the acceptors of devices $Q_1$-$Q_3$. Input A is provided to the injector of $Q_1$, input B is provided to the injector of $Q_2$, and input C is provided to the injector of $Q_3$. The presence of any input $\overline{A}$, $\overline{B}$, or $\overline{C}$ will provide an output A or B or C, respectively.

The I-V characteristics of the three input NOR circuit of FIG. 14.1 are shown in FIG. 14.2. When all the inputs A, B, and C are in the "0" state, devices $Q_1$-$Q_3$ assume the equilibrium characteristics given by the solid curve 86, and nearly all of the current $I_a$ is delivered to the load (not shown). This load is the injector nonlinear characteristics of the fan-out Quiterons. If one or more of the inputs A, B, C are in the "1" state, the non-equilibrium characteristics represented by the dashed curves 88, 90, and 92 are developed, causing the load voltage to switch to $\Delta_3$ and the current to diminish to $\Delta_3/R_j$ (load). Curve 88 appears when one of the inputs is present while curve 90 appears if two inputs are present. Dashed curve 92 appears when all three inputs are present.

FIG. 15.1 shows a multi-injector NOR configuration which is nearly identical to the three input NOR circuit made of discrete Quiterons, as shown in FIG. 14.1. In the circuit of FIG. 15.1, a single acceptor is provided, while three separate injectors are provided, having inputs A, B, and C. A voltage bias $V_s$ is provided through resistor $R_s$ to the acceptor junction. When any of the inputs A, B, or C is present, the output $\overline{A}$ or $\overline{B}$ or $\overline{C}$, respectively, will be provided.

The difference between the circuits of FIGS. 15.1 and 14.1 is evident in the I-V characteristics. The characteristic of FIG. 15.2 shows an additional current transition $I_\alpha$ at $V = \Delta_2 + \Delta_3$. This reflects the fact that the ratio of acceptor area $A_a$ to the injector area $A_i$ is larger than unity for the multi-injector configuration of FIG. 15.1. Therefore, this type of configuration may have a gain advantage as well as a density advantage over the single injector configuration of FIG. 14.1.

The I-V characteristics of FIG. 15.2 are otherwise the same as those of FIG. 14.2. Thus, solid curve 94 is the curve followed when no input is present, dashed curve 96 is the curve followed when one input is present, dashed curve 98 is the one followed when two inputs are present, and dashed curve 100 is the curve followed when all three inputs are present.

Figure 16:
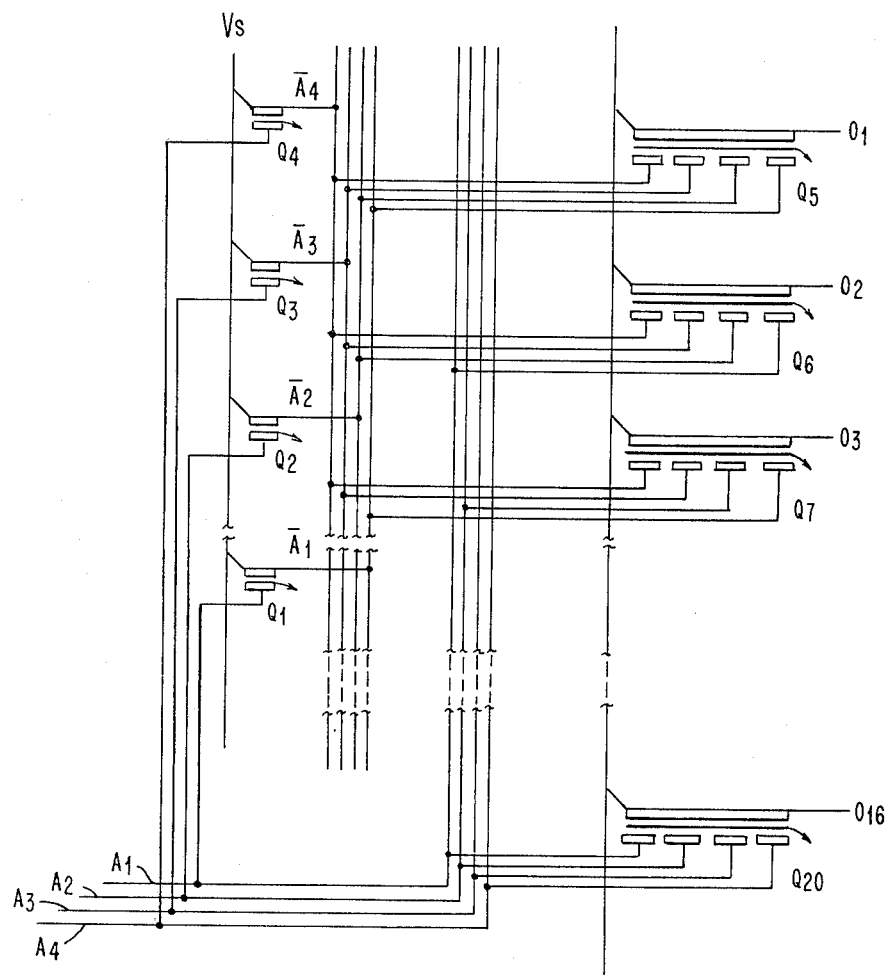
FIG. 16 shows a four-bit decoder using SJA devices, some (Q1–Q4) of which have single injector junctions, while others (Q5–Q20) have multi-injector junctions.

FIG. 16 shows a four-bit decoder using parallel powered NOR blocks. The circuit is comprised of the single injector SJA devices $Q_1$, $Q_2$, $Q_3$, $Q_4$, etc. Multi-injector SJA devices $Q_5$, $Q_6$, $Q_7$, ..., $Q_{20}$ are also provided. The acceptor outputs of $Q_5$–$Q_{20}$ provide the decoder outputs.

The decoder structure of FIG. 16 is similar to other decoders known in the art. Depending upon the injector inputs $A_1$, $A_2$, $A_3$, and $A_4$, devices $Q_1$–$Q_4$ will provide outputs $\overline{A}_1$–$\overline{A}_4$. The outputs of $Q_1$–$Q_4$, as well as the inputs $A_1$–$A_4$, are provided in different combinations to the multiple injectors of $Q_5$–$Q_{20}$. As is well known in the decoder art, depending upon the combinations of the four inputs, 16 outputs $O_1$–$O_{16}$ can be obtained.

Figure 17:
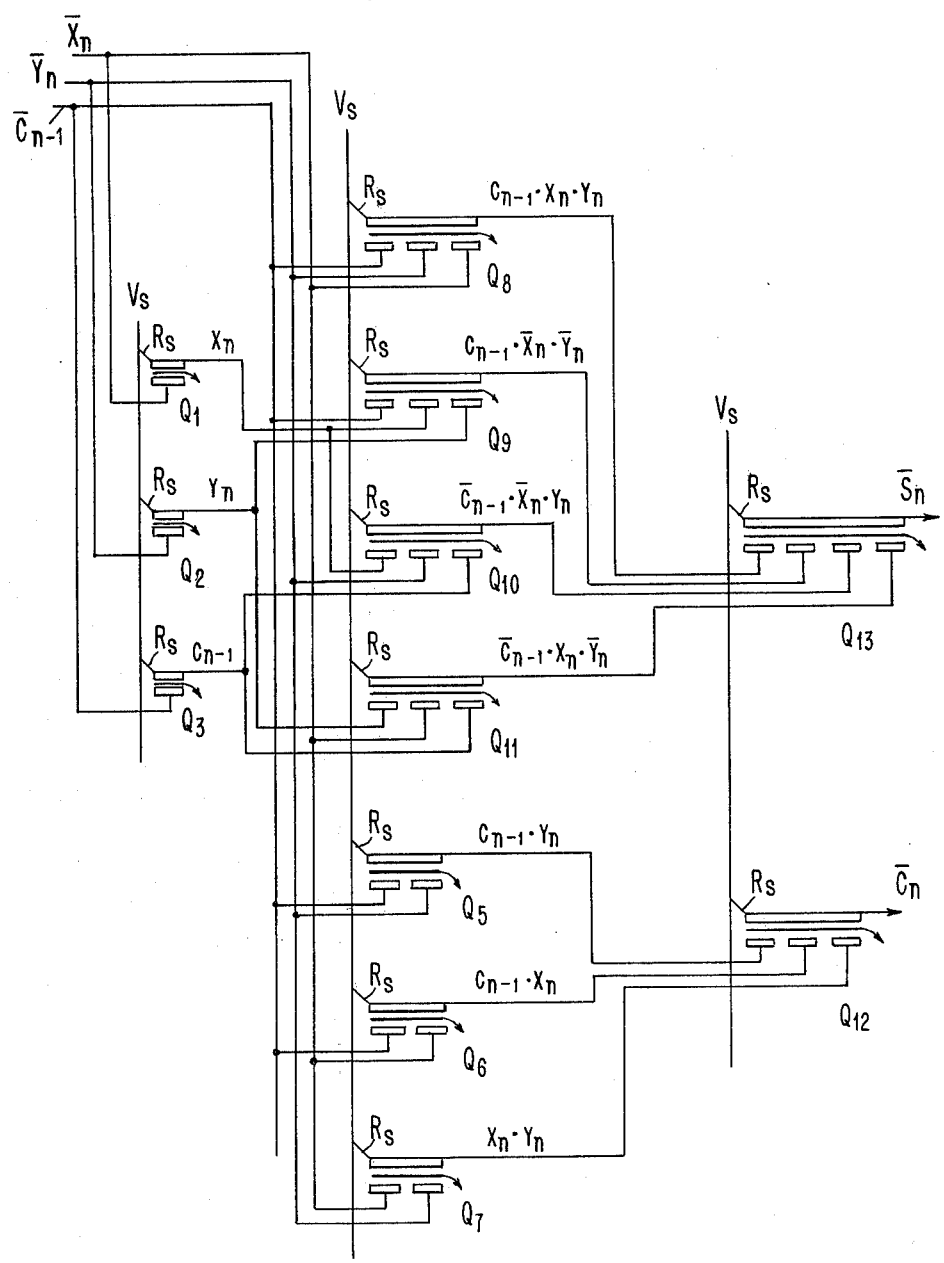
FIG. 17 shows a full adder using Quiteron NOR circuits, and which includes both single junction and multiple injector junction devices.

FIG. 17 shows a one-bit full adder using both SJA and DJA device configurations. The design of this circuit is similar to the design of other full adders and provides as an output the complement $\overline{S}_n$ of the sum signal and the complemet $\overline{C}_n$ of the carry signal. The adder is comprised of three SJA devices $Q_1$–$Q_3$ at the circuit input, and three double injector Quiterons $Q_5$–$Q_7$. Additionally, five triple-injector Quiterons $Q_8$–$Q_{12}$ are used as well as one quadruple injector Quiteron $Q_{13}$. The acceptor junctions of all the Quiterons are provided with the same supply voltage $V_s$ through resistors $R_s$.

Devices $Q_1$–$Q_3$ provide the complements of the inputs $\overline{X}_n$, $\overline{Y}_n$, and $\overline{C}_{n-1}$. The outputs from the acceptors of $Q_1$–$Q_3$ are applied to the injector junctions of Quiterons $Q_9$–$Q_{11}$. Devices $Q_5$–$Q_8$ receive as injector inputs various combinations of the circuit inputs $\overline{X}_n$, $\overline{Y}_n$, and $\overline{C}_{n-1}$. The acceptor outputs of devices $Q_8$–$Q_{11}$ are applied as injector inputs to $Q_{13}$ to develop the complement $\overline{S}_n$, while the acceptor outputs of devices $Q_5$–$Q_7$ are the injector inputs to $Q_{12}$, to provide the complement $\overline{C}_n$ of the carry signal.

Figure 18:
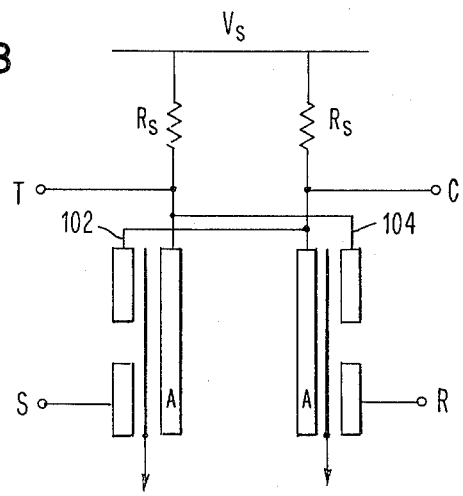
FIG. 18 shows a Quiteron flip-flop circuit, using double injector SJA Quiterons.

Since a Quiteron is an inverter device, it can be utilized to design a flip-flop circuit, such as the NOR flip-flop shown in FIG. 18. A circuit of this type can be used to provide memory latches, as well as memory arrays when an appropriate selection scheme is developed.

The flip-flop is comprised of two double injector Quiterons $Q_1$ and $Q_2$ which are cross-coupled to one another. A DC bias $V_s$ is applied to the acceptor junction of each device $Q_1$ and $Q_2$ through resistances $R_s$. A SET signal S is applied to one injector input of $Q_1$, while a RESET signal R is applied to one injector input of $Q_2$. The other injector input of $Q_1$ is connected, via line 102, to the acceptor output of $Q_2$, while the second injector input to $Q_2$ is connected to the acceptor output of $Q_1$ via electrical connection 104. The operation of the flip-flop is the same as conventional flip-flops, a true signal T and a complement signal C being provided at the acceptor outputs of $Q_1$ and $Q_2$, respectively.

Analog Amplifier

The Quiteron structure can be used to provide analog amplification of the input signals to its injector junction. For this use, it is desirable to change the superconducting gap drastically, but it is not necessary to reduce the gap to zero. In fact, if the gap is reduced to zero, a linear output will not be obtained. Since linearity is important in an amplifier, the input signal should be less than that which would cause the gap of the superconductor into which quasi-particles are injected from vanishing.

Figure 19:
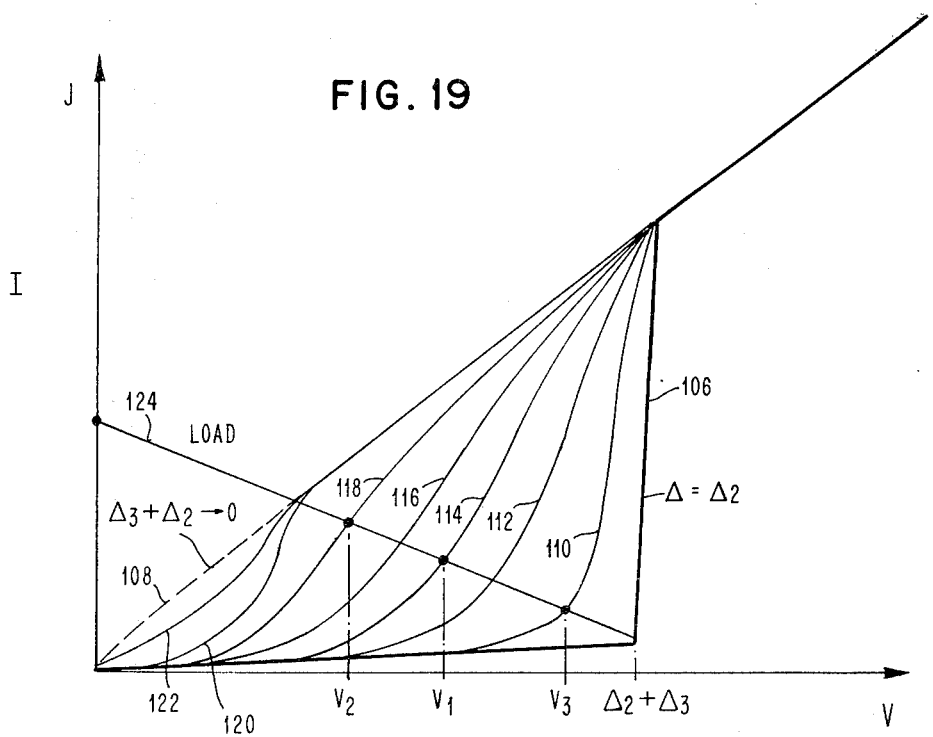
FIG. 19 shows the current-voltage characteristics of a DJA Quiteron used an an amplifier for amplifying analog signals.

FIG. 19 shows the current-voltage characteristics of a Quiteron device used as an analog amplifier. The solid curve 106 is the I-V characteristic when the gap $\Delta = \Delta_2$. That is, this is the equilibrium condition. The dashed curve 108 is the curve which would result if $\Delta_3 + \Delta_2 \rightarrow 0$. As mentioned, a threshold type of operation is necessary for digital switch applications, but this threshold may not be reached when amplification is desired.

Depending upon the magnitude of the input signal to the injector, a family of curves 110, 112, 114, 116, 118, 120, and 122 can be developed. As $\Delta_2$ diminishes, the I-V curves change from 106 to 110, curve 110 is the I-V characteristic when the gap is to 110, etc.

In operation, the amplifier can be biased at a voltage $V_1$, which corresponds to a power input $P \sim \frac{1}{2} P_c$, and the presence of an input signal causes an output which is determined by the linear voltage of the load line 124. Thus, output voltages from $V_2$ to $V_3$ can be obtained depending upon the input signal magnitude. Large current amplification can be obtained in this way, in contrast with the amplifier with of U.S. Pat. No. 4,157,555 in which $P < < P_c$. It is not possible to obtain large signal gain in that prior art transistor. In contrast with this, the superconducting gap is drastically changed to provide a full family of curves 110–122 in order to provide a large gain.

Examples

Although the Quiteron embodiments presented here have been described in detail with respect to the relationships between the superconducting gaps of the different electrodes, it is readily apparent that Quiteron-type devices can be built without maximizing the discrimination ratio, gain, and noise immunity. Examples have been shown for the types of superconductors and their alloys which yield different superconducting gaps. Still further, it is possible to use normal (i.e., non-superconducting) materials for either the top or bottom electrode, or both. However, it is desirable that $S_3$ be a superconductor since this will provide the best gain, discrimination, etc. However, by choosing appropriate superconductors, the Quiteron device characteristics can be enhanced as described previously.

In the preferred embodiments, injection of quasi-particles from a tunnel barrier provides over injection of quasi-particles into the superconductor whose gap is to change. This type of injection input can be modified to use a combination of inputs, such as electrical inputs and photon beams. Thus, a Quiteron can be fabricated in which an electrical signal is applied to the injector junction as well as a photon beam. Also, the input excitation can be due to only the photon beam in order to provide a full optical transistor.

The thicknesses of the various electrode layers are chosen with respect to the device characteristics that are required. In particular, the thin superconducting electrode $S_2$ whose superconducting gap must be drastically altered should be sufficiently thin that this can be achieved without the application of unduly large signals. A representative thickness for the electrode $S_2$ is 500–1,000 angstroms. This is dictated by the fact that the threshold power density $P_c$ must be reached of reasonable power levels. The design proceeds as follows: an $S_2$ thickness of, for example, 500 Å is chosen to obtain $P_c \simeq 1$ watt/cm$^2$ for lead at $V_1 = 2(\Delta_2 + \Delta_3)$. This fixes the injector current density $j_i$ to about 250–500 A/cm$^2$. The acceptor current density can now be chosen to obtain the desired gain which is given by $\sim j_a/j_i \gtrsim 100$, for example.

The thicknesses of the tunnel barriers are chosen to provide appropriate ratios of the current densities $j_a$ and $j_i$. While the presence of Josephson tunneling current through either of the junctions is not required for operation of this device, tunnel barriers can be provided where Josephson current is present. This current could be used to provide a device with three states, which is capable of latching. Representative values for the thicknesses of the injector and acceptor tunnel junctions are such that a current density ratio $j_a/j_i \gtrsim 100$ is obtained. Devices employing Josephson currents, and devices using different biasing will now be described.

Quiteron With Different Biasing (FIGS. 20.1 and 20.2)

For illustrative purposes, a SJA device is shown in FIG. 20.1, while its I-V characteristic is shown in FIG. 20.2. Quiteron 126 is comprised of three electrodes $S_1$, $S_2$, and $S_3$, the injector junction 128, and the acceptor junction 130. Current source 132 provides injection current $I_i$ while the acceptor junction 130 is biased by current source 134, which produces current $I_a$. In contrast with the previously shown biasing schemes, load 136 is connected across $S_1$ and $S_3$ in this embodiment.

In FIG. 20.2, the equilibrium curve 138 has a current transition at $\Delta_1 + 2\Delta_2 + \Delta_3$, in contrast with the usual equilibrium curve for a SJA device, which has a curent transition at $\Delta_2 + \Delta_3$. Thus, a greater discrimination can be obtained between the "1" and "0" states. Here, the total equilibrium voltage curve depends upon the voltages across both the injector and acceptor barriers. For this reason, a larger voltage swing can be obtained than with the other SJA embodiments. However, the voltage swing is not necessarily greater than that which is obtained with a DJA structure, and the biasing technique of FIG. 20.1, is not as satisfactory from the standpoint of isolation between the output and the input.

Josephson State Quiterons (FIGS. 21.1, 21.2, 22, and 23)

These embodiments describe switching between multiple output states, at least one of which is a Josephson state exhibiting 0-voltage current. One of these embodiments (FIG. 23), three distinguishable output states are provided.

In more detail, FIG. 21.1 shows a SJA structure including electrodes $S_1$, $S_2$, and $S_3$. $S_2$ and $S_3$ are superconductors, while $S_1$ can be a superconductor or a normal material. Injector tunnel barrier 140 is located between $S_1$ and $S_2$, while acceptor tunnel barrier 142 is located between $S_2$ and $S_3$. A linear load 144 is connected to the acceptor electrode $S_3$. Injector current $I_i$ flows into $S_1$ and out of $S_2$, while the acceptor is biased by current $I_a$ which flows into $S_3$ and out of $S_2$. If barrier 142 is sufficiently thin, a zero-voltage current will tunnel through this barrier in accordance with the Josephson effect. As an alternative, the acceptor can be comprised of a weak link if one of the device output states is a zero-voltage current. For this embodiment the term "tunnel junction" is meant to include a weak link device as well as one having electrodes separated by a tunnel barrier, i.e., any device exhibiting a Josephson current.

The I-V characteristics of the Quiteron of FIG. 21.1 are shown in FIG. 21.2. Different curves are obtained for different values of the Stewart-McCumber hysteresis parameter $\beta$. This parameter is known in the art and is one which measures the amount of hysteresis obtained when the current-voltage characteristics are plotted. A junction will exhibit hysteretic effects when $\beta \gg 1$ and will be non-hysteretic for values of $\beta \lesssim 1$. As is known, $\beta$ is given by the following expression:

$$\beta = (2\pi/\Phi_0) I_0 R^2 C_j \qquad (8)$$

where $\Phi_0$ is a single flux quantum, $I_0$ is the Josephson critical current through tunnel barrier 142, R is the total junction resistance, and $C_j$ is the junction capacitance.

Curve 146 is the equilibrium curve of the Quiteron where $\beta \gg 1$ (i.e., a hysteretic junction) while curve 150 represents the equilibrium state when $\beta \ll 1$. When $P > P_c$ is applied, the characteristic switches to that depicted by curve 148 or curve 152, depending on the amount of power overdrive.

In FIG. 21.2, two load lines having slopes $R_{L1}$ and $R_{L2}$ are shown. A zero-voltage Josephson state can occur when Josephson current tunnels through the acceptor junction. This occurs for $\beta \ll 1$. As P increases to $P_c$, the device switches from a Josephson state to a state driven by the intersection of the load line and curve 152. Thus, this Quiteron is non-inverting, and non-latching.

Figure 22:
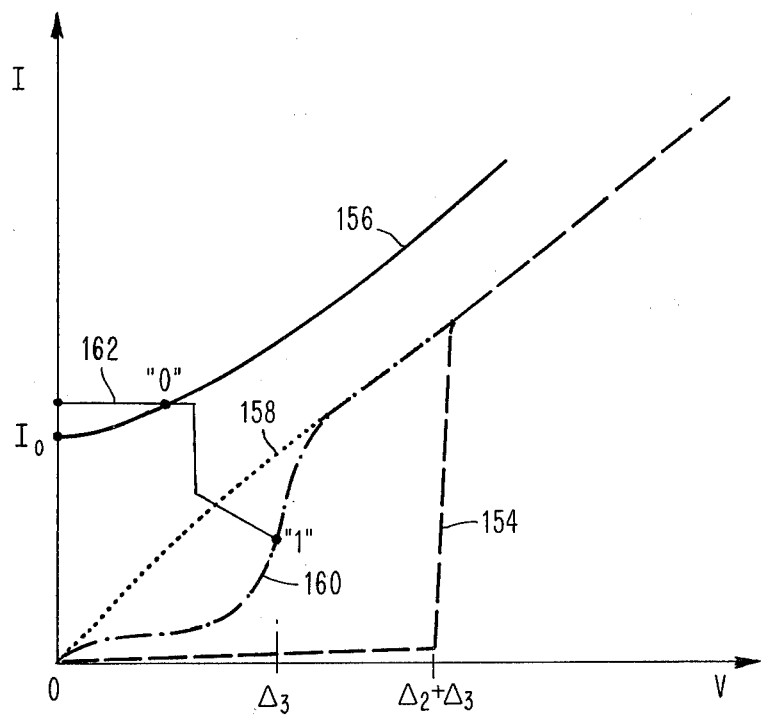
FIG. 22 shows the I-V characteristics of the device of FIG. 21.1 when it is switched from a Josephson state to another state, where the load is now a non-linear load (such as another Quiteron device).

FIG. 22 shows the I-V characteristics of a Quiteron exhibiting a 0-voltage Josephson state, where the load is now a nonlinear load, such as that represented by another Quiteron device. Equilibrium curve 154 represents the I-V characteristic for a junction having $\beta \gg 1$ (hysteretic), while the solid line curve 156 represents the equilibrium curve for a junction in which $\beta \ll 1$ (non-hysteretic). Curves 154 and 156 are the equilibrium curves when $P \ll P_c$. Curve 158 is the usual curve when the hysteretic junction is switched to $\Delta_2 + \Delta_3 = 0$, while curve 160 is the I-V characteristic when a non-hysteretic junction has $\Delta_2 = 0$. Nonlinear load line 162 intersects curve 156 at a point corresponding to a binary "0", and intersects curve 160 at a point representing a binary "1" state.

The device of FIG. 22 is non-inverting, and non-latching.

Figure 23:
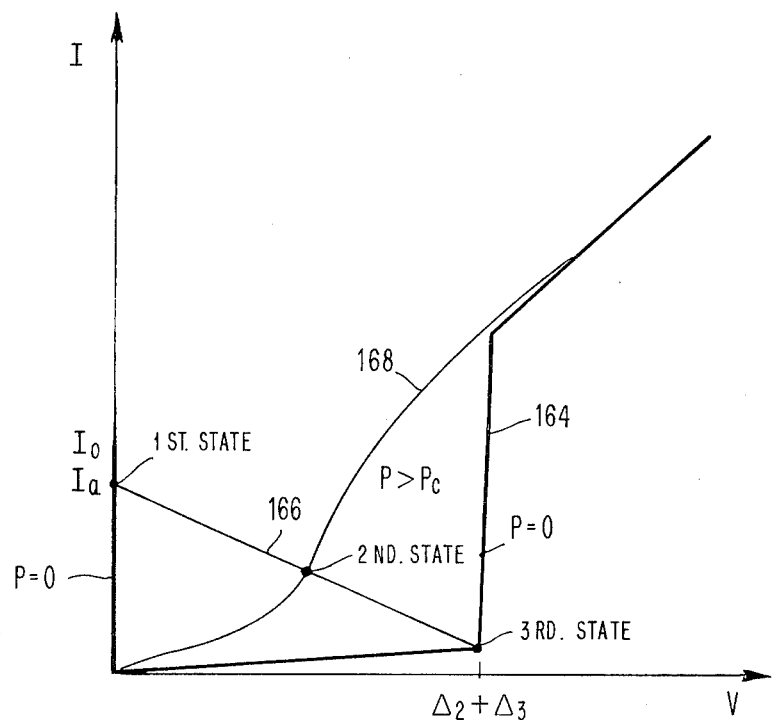
FIG. 23 shows the I-V characteristics of the device of FIG. 21.1 when it is biased to have three distinguishable states, one of which is a Josephson state.

FIG. 23 shows an I-V curve for the Quiteron of FIG. 21.1 biased to have three states, where one state is a Josephson zero voltage state. The Quiteron of FIG. 21.1 has an equilibrium curve 164 and, if the acceptor barrier is sufficiently thin and there is magnetic shielding, a Josephson current can flow through the acceptor barrier. For the Quiteron of FIG. 23, $\beta \gg 1$, and the load is linear, as shown by linear load line 166. Curve 168 represents the situation when $P > P_c$.

When $P=0$, and $I > I_0$ ($I_0$ is the Josephson critical current), a Josephson zero-voltage state (first state) can exist. When the Quiteron is switched by an input power $P > P_c$, $\Delta_2$ vanishes and another state (second state) exists at the intersection of the load line and curve 168. Now, when the power is removed, the Quiteron switches to a third state represented by the intersection of load line 166 and curve 164. In order to retrieve the first state, the current $I_a$ has to be removed and applied again. Therefore, this is a non-inverting and latching device.

What has been described is a new superconducting device which can be used as a digital switch and as a high gain amplifier. In contrast with prior art devices, the superconducting gap of an electrode is caused to vanish in order to provide a switch, and is reduced almost to zero to provide a large gain amplifier. When operated as a switch, the device has a gain at least as great as 10, and can be operated in a manner to be latching or non-latching. It can be made in very dense arrays of different geometry. It can exhibit inverting characteristics and provides both high noise immunity, and good discrimination between its digital output states. Extremely small energies are required to switch the device and it can be used in logic circuits. Such circuits would include a plurality of similar devices so that the output of one device is the input of another device.

While the invention has been particularly shown and described with reference to preferred embodiments thereof, it will be understood by those skilled in the art that the foregoing and other changes in form and details may be made therein without departing from the spirit and scope of the invention.

Having thus described my invention, what I claim as new, and desire to secure by Letters Patent is:

1. A superconducting device comprising in combination:
    a tunnel junction comprised of two electrodes separated by a tunneling barrier, wherein one of said electrodes is a superconductor, said tunnel junction exhibiting a threshold power density at which an excess number of quasi-particles exists causing the superconducting gap of said superconducting electrode to vanish,
    means for injecting power of the order of said threshold power density into said superconducting electrode,
    load means connected to said tunnel junction for receiving the output of said tunnel junction.

2. The device of claim 1, where said means for injecting power includes a second tunnel junction having as one electrode thereof said superconductor.

3. The device of claim 2, where said device is comprised of three electrically conducting layers separated by two tunnel barriers, one of said electrodes being said superconductor.

4. The device of claim 3, where said three electrically conducting layers are superconductors.

5. The device of claim 4, where the superconductor into which power is injected is thinner than the other superconductors, and sufficiently thin that its superconducting gap can be suppressed to zero when said threshold power density is exceeded.

6. The device of claim 4, where said three superconductors are comprised of the same material.

7. the device of claim 2, where said second tunnel junction is comprised of a plurality of tunnel junctions.

8. The device of claim 7, further including inputs to each of said plurality of second tunnel junctions for injection of power into said superconductor.

9. The device of claim 1, where said means for injecting power includes means for injecting excess quasi-particles into said superconductor, the amount of said injected quasi-particles being in excess of the amount in said superconductor at thermal equilibrium.

10. The device of claim 1, where said tunnel junction includes as a first electrode thereof said superconductor and as a second electrode thereof a second superconductor.

11. The device of claim 10, where said tunnel barrier is comprised of a material exhibiting a sharp current transition in its current-voltage characteristic.

12. The device of claim 11, where said tunnel barrier is comprised of an insulating material.

13. The device of claim 1, where said tunnel junction is comprised of a plurality of tunnel junctions in series.

14. The device of claim 1, where said tunnel junction is comprised of a tunnel barrier which is sufficiently thin that zero-voltage Josephson current can tunnel therethrough.

15. The device of claim 14, where said device has at least three stable output states, one of which is a zero-voltage state in which Josephson current flows through said tunnel junction.

16. The device of claim 1, where said means for injecting power includes means for striking said superconductor with an optical beam in order to inject excess quasi-particles therein.

17. A superconducting device, comprising in combination:
    an injector tunnel junction comprising an injector tunnel barrier located between two electrodes, at least one of which is a superconductor,
    injector bias means for producing tunneling through said injector tunnel junction into said superconductor,
    an acceptor tunnel junction comprising a second tunnel barrier and having as one electrode thereof said superconductor, the current-voltage characteristics of said acceptor tunnel junction being changeable depending upon the change in superconducting gap of said superconductor when excess quasi-particles are injected into said superconductor by said injector tunnel junction,
    means for biasing said acceptor tunnel junction to produce tunneling current therethrough,
    wherein said injector tunnel junction and said injector bias means comprise a means for drastically changing said superconducting gap of said superconductor.

18. The device of claim 17, where said acceptor tunnel junction exhibits a sharp current transition in its current-voltage characteristic.

19. The device of claim 17, wherein said injector tunnel junction is comprised of a plurality of tunnel junctions in series.

20. The device of claim 17, where said acceptor tunnel junction is comprised of a plurality of tunnel junctions in series.

21. The device of claim 17, further including a load means electrically connected to the output of said acceptor tunnel junction.

22. The device of claim 21, where said load means is another said superconducting device.

23. The device of claim 17, where said means for drastically changing the superconducting gap of said superconductor includes means for impinging an optical beam on said superconductor.

24. The device of claim 17, where the superconducting gap of said superconductor is caused to vanish by heavy injection of excess quasi-particles in said superconductor.

25. The device of claim 17, where the electrodes for said injector tunnel junction and said acceptor tunnel junction are superconductors.

26. The device of claim 25, where all of said superconductors are comprised of the same material.

27. The device of claim 17, where said acceptor tunnel barrier is comprised of an insulating material.

28. The device of claim 17, where said injector tunnel junction is biased to produce an excess number of energetic quasi-particles in said superconductor, the number of quasi-particles introduced therein being greater than the amount which would be produced therein at thermal equilibrium.

29. The device of claim 17, where said electrodes of said injector and acceptor tunnel junctions are non-coplanar.

30. The device of claim 17, where said device exhibits an inverting characteristic between its input and its output.

31. The device of claim 17, including means for producing zero-voltage Josephson tunneling current through said acceptor tunnel junction.

32. A superconducting device, comprising in combination:
first, second, and third current carrying electrodes, said second and third electrodes being superconductors, there being tunneling barriers located between said first and second electrodes, and between said second and third electrodes, wherein the current-voltage characteristic of the tunnel junction comprising said second and third electrodes and the tunnel barrier therebetween exhibits a sharp current transition in its current-voltage characteristic at $n(\Delta_2+\Delta_3)$, where $n=1, 2$ and $\Delta_2$ and $\Delta_3$ are the superconducting bandgaps of said second and third electrodes, respectively,
injector means for injecting excess energetic quasi-particles into said second electrode to produce sufficient injection that $\Delta_2 \to 0$, said injector means including said first electrode and the tunnel barrier between said first and second electrodes.

33. The device of claim 32, where said first electrode is also comprised of a superconducting material.

34. The device of claim 32, including means for biasing said injector means such that the power injected into said second electrode exceeds the threshold power density of said second electrode, and load means connected to said third electrode.

35. The device of claim 34, where said load means is another said superconducting device.

36. The device of claim 33, where said first electrode is a superconductor having a superconducting bandgap $\Delta_1$, and $\Delta_3 < \Delta_1 + \Delta_2 < \Delta_2 + \Delta_3$.

37. The device of claim 33, where said first electrode is a superconductor having a superconducting bandgap $\Delta_1$, and $2\Delta_3 < \Delta_1 + \Delta_2 < 2(\Delta_2+\Delta_3)$.

38. The device of claim 37, where $\Delta_1 = \Delta_2 = \Delta_3$.

39. A superconducting device, comprising in combination:
first, second, and third current carrying electrodes, there being an injector tunnel barrier located between said first and second electrodes and an acceptor tunnel barrier located between said second and third electrodes, where said second and third electrodes are superconductors and said second tunnel barrier is sufficiently thin that zero-voltage Josephson current can tunnel through said acceptor tunnel barrier,
bias means for biasing said injector tunnel barrier to produce excess quasi-particles in said second electrode of a number such that the superconducting bandgap $\Delta_2$ of said second electrode $\to 0$, and
load means connected to said third electrode,
wherein said superconducting device has multiple output states, one of which is a voltage at least as large as $(\Delta_2+\Delta_3)$, where $\Delta_3$ is the superconducting bandgap of said third electrode.

40. The superconducting device of claim 39, where said device exhibits at least three stable output states.

41. The device of claim 39, where said load means is a superconductive device including a tunnel junction comprised of a tunnel barrier located between two electrodes at least one of which is superconducting, and wherein said second superconducting device is driven such that the superconducting bandgap of its superconducting electrode vanishes.

42. A NOR circuit comprising at least three superconducting devices, each of said superconducting devices being comprised of an acceptor tunnel junction including a first superconducting electrode, a tunnel barrier in contact with said first superconducting electrode, a second electrode, and means for injecting excess quasi-particles into said superconducting electrode to drastically change its superconducting bandgap, the second electrodes of said superconducting devices being electrically connected, and bias means for providing a current through said first and second electrodes and the tunnel barrier therebetween.

43. A superconducting device, comprising in combination:
a tunnel junction comprising first and second electrodes and a tunnel barrier therebetween where said first electrode is comprised of a superconducting material,
a plurality of injection means for injecting excess quasi-particles into said first superconducting electrode in order to make the superconducting bandgap of said first electrode vanish.

44. The device of claim 43, where said injection means is comprised of a plurality of injection tunnel junctions, said injection tunnel junctions including as one electrode thereof said first superconducting electrode, there being separate inputs applied to each of said injection tunnel junctions.

45. A superconducting circuit, comprising in combination:

first and second cross-coupled superconducting devices, each said superconducting device including first and second electrodes having a tunnel barrier therebetween, said first electrodes being superconducting, first injection means associated with said first superconducting device for injecting an excess number of quasi-particles into the first superconducting electrode of said first superconducting device in order to drastically change the superconducting bandgap of said superconducting electrode, second injection means associated with said second superconducting device for injecting an excess number of quasi-particles into the superconducting electrode of said second device in order to drastically change the superconducting bandgap of said superconducting electrode in said second superconducting device, wherein the second electrode of said first superconducting device is electrically connected to said second injection means, and the second electrode of said second superconducting device is electrically connected to said first injection means.

46. The device of claim 45, including bias means for biasing the second electrode in each said superconducting device.

47. The circuit of claim 45, including means for providing an electrical signal to said first injection means and an electrical signal to said second injection means.

48. The circuit of claim 47, where said first and second injection means include an injector tunnel junction biased to produce said excess number of quasi-particles in the superconducting electrodes of said first and second devices.

49. A superconducting device comprising, in combination:
   a tunnel junction comprising first and second electrodes separated by a tunnel barrier, said first and second electrodes being comprised of superconducting materials having superconducting bandgaps $\Delta_2$ and $\Delta_3$, respectively, said tunnel junction being characterized by a threshold power density $P_c$ at which the superconducting gap $\Delta_2$ vanishes,
   injection means for injecting power into said first superconducting electrode, said injection means producing an injection current density $j_i$ into said first superconducting electrode having a magnitude such that $P_c$ is reached at output voltages from said superconducting device in the order of $(\Delta_2+\Delta_3)$.

50. The device of claim 49, wherein said injection means includes an injector tunnel junction having as one electrode said first superconducting electrode, said injector tunnel junction being connected to an injector bias source for producing said current $j_i$ through said injector tunnel junction, and further including a load means connected to the output of said superconducting device.

51. The device of claim 50, where said load means is another one of said superconductor devices.

52. The device of claim 49, where said load means is comprised of another one of said superconductive devices electrically connected to the output of said superconductive device.

53. The superconducting device of claim 49, where the current-voltage characteristic of said tunnel junction exhibits a sharp current transition.

54. The device of claim 53, where said transition occurs at a voltage of the order of $(\Delta_2+\Delta_3)$.

55. The device of claim 49, where said tunnel barrier located between said first and second electrodes is sufficiently thin that Josephson current can tunnel therethrough.

56. The device of claim 49, wherein said device exhibits an inverting characteristic.

57. The device of claim 49, where said injection means is a weak link device.

58. The device of claim 50, where said injector tunnel junction includes a second electrode which is comprised of a normal material.

59. A superconducting device comprising, in combination:
   a tunnel junction providing a voltage output V across a load and a including a current-carrying superconductor for carrying current which tunnels through said junction, said superconductor having a superconducting bandgap $\Delta$ characterized by a threshold power density $P_c$ at which $\Delta$ vanishes,
   injection means for injecting power into said superconductor,
   said injection means producing an injection current density $j_i$ into said superconductor having a magnitude such that $P_c$ is reached at a voltage V in excess of said bandgap $\Delta$.

60. The device of claim 59, where said tunnel junction includes a second superconductor having a superconducting bandgap $\Delta_2$, and wherein $P_c$ is reached at a voltage V at least as large as $(\Delta+\Delta_2)$.

61. The device of claim 60, where $\Delta=\Delta_2$.

62. The device of claim 59, further including means for producing zero-voltage Josephson current through said tunnel junction.

63. A superconducting device, comprising:
   injection means including a first superconductor with a superconducting bandgap $\Delta_1$ for injecting power into a second superconductor having a superconducting bandgap $\Delta_2$, said injection means producing excess quasi-particles in said second superconductor of an amount such that a threshold power density $P_c$ at which $\Delta_2 \rightarrow 0$ is reached at a voltage in excess of said bandgap $\Delta_2$,
   a tunnel device having a tunnel current therethrough and including said second superconductor, said tunnel device having a threshold power density relationship $P_c(\epsilon)$ which exhibits a sharp transition at $\epsilon=eV_{TC}/(\Delta_1+\Delta_2)\approx 1$ such that $P_c(0)/P_c(\infty)$ is $>>1$.

64. The device of claim 63, where said injection means is another tunnel device.

65. The device of claim 63, where said tunnel current has a density $j_a$, and said injection means produces an injection current with density $j_i$, said superconductive device having a gain after said threshold is reached which is proportional to the ratio $j_a/j_i$.

66. The superconductive device of claim 63, where said tunnel device includes means for producing Josephson zero-voltage current therethrough.

67. The superconductive device of claim 63, further including a load connected to said tunnel device, said load being another of said superconducting devices.

* * * * *